(12) United States Patent
Yu et al.

(10) Patent No.: US 12,368,280 B2
(45) Date of Patent: Jul. 22, 2025

(54) SEMICONDUCTOR DEVICE AND METHOD

(71) Applicant: Taiwan Semiconductor Manufacturing Co., Ltd., Hsinchu (TW)

(72) Inventors: Chen-Hua Yu, Hsinchu (TW); An-Jhih Su, Taoyuan (TW); Chia-Nan Yuan, Hsinchu (TW); Shih-Guo Shen, New Taipei (TW); Der-Chyang Yeh, Hsinchu (TW); Yu-Hung Lin, Taichung (TW); Ming Shih Yeh, Zhubei (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 747 days.

(21) Appl. No.: 17/240,620

(22) Filed: Apr. 26, 2021

(65) Prior Publication Data
US 2021/0281037 A1    Sep. 9, 2021

Related U.S. Application Data

(62) Division of application No. 16/207,974, filed on Dec. 3, 2018, now Pat. No. 10,992,100.

(Continued)

(51) Int. Cl.
*H01S 5/02* (2006.01)
*H01L 23/00* (2006.01)
(Continued)

(52) U.S. Cl.
CPC ............ *H01S 5/0203* (2013.01); *H01L 24/16* (2013.01); *H01S 5/0206* (2013.01);
(Continued)

(58) Field of Classification Search
CPC ........ H01S 5/0282–0283; H01S 5/183–18397; H01S 5/04256–04257; H01S 2301/176; H01S 5/028
See application file for complete search history.

(56) References Cited

U.S. PATENT DOCUMENTS

| 4,738,937 | A |   | 4/1988 | Parsons |
| 5,719,893 | A | * | 2/1998 | Jiang ..................... B82Y 20/00 |
|   |   |   |   | 372/45.01 |

(Continued)

FOREIGN PATENT DOCUMENTS

| CN |   | 1971877 A | 5/2007 |
| CN |   | 104054171 A | 9/2014 |

(Continued)

OTHER PUBLICATIONS

"The Authoritative Dictionary of IEEE StandardsTerms," 7th Edition, Dec. 11, 2000, p. 112.

*Primary Examiner* — Sean P Hagan
(74) *Attorney, Agent, or Firm* — Slater Matsil, LLP

(57) ABSTRACT

In some embodiments, laser devices having contact pads are formed. The laser diodes are formed from a doped semiconductive material. The contact pads and semiconductive material share an ohmic junction. Underbump metallurgies are formed on the contact pads. Conductive connectors are electrically coupled to the laser devices. The underbump metallurgies help prevent metal inter-diffusion between the contact pads and conductive connectors. As such, when reflowing the conductive connectors, the junction of the contact pads and semiconductive material may retain its ohmic properties.

20 Claims, 22 Drawing Sheets

Related U.S. Application Data

(60) Provisional application No. 62/694,759, filed on Jul. 6, 2018.

(51) Int. Cl.

| | | |
|---|---|---|
| *H01S 5/0234* | (2021.01) | |
| *H01S 5/0237* | (2021.01) | |
| *H01S 5/026* | (2006.01) | |
| *H01S 5/028* | (2006.01) | |
| *H01S 5/042* | (2006.01) | |
| *H01S 5/183* | (2006.01) | |
| *H01S 5/30* | (2006.01) | |
| *H01S 5/323* | (2006.01) | |
| *H01S 5/42* | (2006.01) | |

(52) U.S. Cl.
CPC .......... *H01S 5/0217* (2013.01); *H01S 5/0234* (2021.01); *H01S 5/0237* (2021.01); *H01S 5/026* (2013.01); *H01S 5/0282* (2013.01); *H01S 5/0421* (2013.01); *H01S 5/04252* (2019.08); *H01S 5/04256* (2019.08); *H01S 5/3054* (2013.01); *H01S 5/32316* (2013.01); *H01L 2224/0401* (2013.01); *H01L 2224/16148* (2013.01); *H01L 2224/16503* (2013.01); *H01S 5/04254* (2019.08); *H01S 5/18305* (2013.01); *H01S 5/18311* (2013.01); *H01S 5/423* (2013.01); *H01S 2301/176* (2013.01)

(56) References Cited

U.S. PATENT DOCUMENTS

| | | | |
|---|---|---|---|
| 6,048,762 A | 4/2000 | Hsia et al. | |
| 6,184,066 B1 | 2/2001 | Chino et al. | |
| 6,614,058 B2 | 9/2003 | Lin et al. | |
| 6,642,079 B1 | 11/2003 | Liu et al. | |
| 6,661,823 B1 | 12/2003 | Otoma et al. | |
| 7,172,945 B2 | 2/2007 | Shioga et al. | |
| 7,538,375 B2 | 5/2009 | Kim et al. | |
| 7,808,030 B2 | 10/2010 | Mizuno et al. | |
| 7,936,568 B2 | 5/2011 | Mashino | |
| 8,690,397 B2 | 4/2014 | Muraguchi | |
| 9,355,936 B2 | 5/2016 | Cooney, III et al. | |
| 9,666,522 B2 | 5/2017 | Huang et al. | |
| 9,859,218 B1 | 1/2018 | Patlolla et al. | |
| 10,262,952 B2 | 4/2019 | Chen et al. | |
| 10,321,577 B2 | 6/2019 | Shang et al. | |
| 10,497,796 B1 | 12/2019 | Cheng et al. | |
| 11,158,775 B2 | 10/2021 | Yu et al. | |
| 2001/0006528 A1 | 7/2001 | Sato et al. | |
| 2002/0086520 A1 | 7/2002 | Chiang | |
| 2002/0150135 A1* | 10/2002 | Naone ................. | H01S 5/18369 372/45.011 |
| 2003/0136997 A1 | 7/2003 | Shioga et al. | |
| 2003/0160258 A1* | 8/2003 | Oohata ............... | H01S 5/32325 257/E33.059 |
| 2004/0062283 A1 | 4/2004 | Takeuchi et al. | |
| 2004/0092055 A1 | 5/2004 | Liu | |
| 2005/0067625 A1* | 3/2005 | Hata .................... | G02B 6/1226 257/E33.068 |
| 2005/0095781 A1 | 5/2005 | Papa Rao et al. | |
| 2007/0105265 A1 | 5/2007 | Lai et al. | |
| 2007/0222030 A1 | 9/2007 | Salama et al. | |
| 2007/0235790 A1 | 10/2007 | Kim et al. | |
| 2007/0249109 A1* | 10/2007 | Kamiyama ............ | B82Y 20/00 257/E31.022 |
| 2008/0031295 A1 | 2/2008 | Tanaka | |
| 2008/0291649 A1 | 11/2008 | Mashino | |
| 2009/0020777 A1 | 1/2009 | Iwata et al. | |
| 2009/0175307 A1 | 7/2009 | Ryu et al. | |
| 2010/0025817 A1 | 2/2010 | Mihara | |
| 2010/0051978 A1 | 3/2010 | Katsuno et al. | |
| 2010/0067243 A1* | 3/2010 | Muraguchi ....... | H01L 31/02164 362/382 |
| 2010/0215070 A1 | 8/2010 | Hattori | |
| 2010/0295149 A1 | 11/2010 | Summerfelt et al. | |
| 2011/0211604 A1 | 9/2011 | Roscher | |
| 2011/0306214 A1 | 12/2011 | Zin | |
| 2012/0025370 A1 | 2/2012 | Wholey et al. | |
| 2012/0104450 A1 | 5/2012 | Chen et al. | |
| 2012/0142177 A1 | 6/2012 | Kim et al. | |
| 2012/0181562 A1 | 7/2012 | Lee et al. | |
| 2012/0266810 A1 | 10/2012 | Lan et al. | |
| 2013/0241080 A1 | 9/2013 | Pagaila | |
| 2014/0048951 A1 | 2/2014 | Lin et al. | |
| 2014/0131858 A1 | 5/2014 | Pan et al. | |
| 2014/0209908 A1 | 7/2014 | Cooney, III et al. | |
| 2014/0217604 A1 | 8/2014 | Chou et al. | |
| 2015/0108635 A1 | 4/2015 | Liang et al. | |
| 2015/0187991 A1 | 7/2015 | McGroddy et al. | |
| 2015/0214128 A1 | 7/2015 | Lin et al. | |
| 2015/0228538 A1 | 8/2015 | Wada et al. | |
| 2015/0279776 A1 | 10/2015 | Hu et al. | |
| 2015/0357320 A1 | 12/2015 | Yu et al. | |
| 2016/0141219 A1 | 5/2016 | Liu | |
| 2016/0163578 A1 | 6/2016 | Yu et al. | |
| 2016/0268231 A1 | 9/2016 | Karhade et al. | |
| 2016/0308089 A1 | 10/2016 | Kim et al. | |
| 2017/0033026 A1 | 2/2017 | Ho et al. | |
| 2017/0133549 A1 | 5/2017 | Xu et al. | |
| 2017/0162746 A1 | 6/2017 | Cha et al. | |
| 2017/0229358 A1 | 8/2017 | Cooney, III et al. | |
| 2017/0250205 A1 | 8/2017 | Yamazaki | |
| 2017/0330767 A1 | 11/2017 | Kang et al. | |
| 2018/0061697 A1 | 3/2018 | Yamada | |
| 2018/0114938 A1 | 4/2018 | Yasukawa | |
| 2018/0130707 A1 | 5/2018 | Clendenning et al. | |
| 2018/0151589 A1 | 5/2018 | Shimizu et al. | |
| 2018/0158712 A1 | 6/2018 | Ekkels et al. | |
| 2018/0211912 A1 | 7/2018 | Yu et al. | |
| 2019/0097392 A1 | 3/2019 | Cao et al. | |
| 2019/0139888 A1 | 5/2019 | Yu et al. | |
| 2019/0252312 A1 | 8/2019 | Yu et al. | |
| 2019/0273018 A1 | 9/2019 | Yu et al. | |
| 2019/0371777 A1 | 12/2019 | Iguchi | |
| 2019/0378962 A1 | 12/2019 | Yu et al. | |
| 2020/0006271 A1 | 1/2020 | Chen et al. | |
| 2020/0219956 A1 | 7/2020 | Aoki et al. | |
| 2020/0251380 A1 | 8/2020 | Yu et al. | |
| 2022/0165611 A1 | 5/2022 | Yu et al. | |

FOREIGN PATENT DOCUMENTS

| | | |
|---|---|---|
| CN | 104401934 A | 3/2015 |
| JP | H09223848 A | 8/1997 |
| JP | 2003197463 A | 7/2003 |
| JP | 2006059933 A | 3/2006 |
| JP | 2008042118 A | 2/2008 |
| JP | 2017216285 A | 12/2017 |
| KR | 100729360 B1 | 6/2007 |
| KR | 20120121951 A | 11/2012 |
| KR | 20150012950 A | 2/2015 |
| KR | 20150137967 A | 12/2015 |
| KR | 20160083035 A | 7/2016 |
| KR | 20160124375 A | 10/2016 |
| KR | 20170015260 A | 2/2017 |
| KR | 20170064775 A | 6/2017 |

\* cited by examiner

SEMICONDUCTOR DEVICE AND METHOD

PRIORITY CLAIM AND CROSS-REFERENCE

This application is a division of Ser. No. 16/207,974, filed on Dec. 3, 2018, entitled "Semiconductor Device and Method," which claims the benefit of U.S. Provisional Patent Application No. 62/694,759, filed on Jul. 6, 2018, which applications are hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. Optical features have been integrated with semiconductor devices in increasingly more applications in recent years, particularly due to the rising demand for cameras in phones, tables, and other portable devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
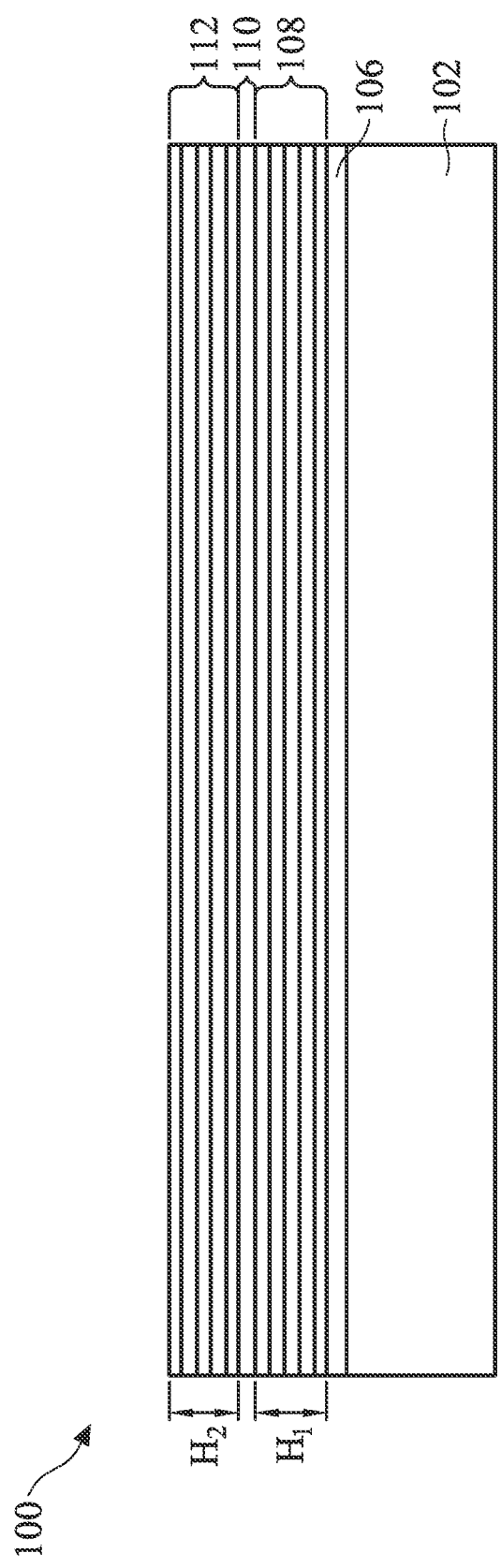
FIGS. 1 through 7 illustrate various cross-sectional view of a process for forming laser devices, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, laser devices having contact pads are formed. The laser diodes of the laser devices are PIN diodes formed from a doped semiconductive material, such as doped GaAs. The contact pads and semiconductive material share an ohmic junction. Under-bump metallurgies (UBMs) are formed on the contact pads before conductive connectors are electrically coupled to the laser devices. The UBMs help prevent metal inter-diffusion between the contact pads and conductive connectors. As such, when reflowing the conductive connectors, the junction of the contact pads and semiconductive material may retain its ohmic properties. Electrical connections of a low contact-resistance may thus be formed for the laser devices.

FIGS. 1 through 7 illustrate various cross-sectional view of a process for forming laser devices, in accordance with some embodiments. A first structure 100 is formed including a carrier substrate 102 having a plurality of laser devices 104 (see FIG. 7) formed thereon. The laser devices 104 include single-frequency laser diodes. In the embodiment shown, the laser devices 104 include vertical-cavity surface-emitting laser devices. It should be appreciated that the laser devices 104 may include other types of diodes such as distributed Bragg reflector (DBR) laser diodes, light emitting diodes (LEDs), or the like.

In FIG. 1, a carrier substrate 102 is provided. The carrier substrate 102 may be a semiconductor substrate, such as a bulk semiconductor, a semiconductor-on-insulator (SOI) substrate, or the like, which may be doped (e.g., with a p-type or n-type dopant) or undoped. The carrier substrate 102 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the carrier substrate 102 may include silicon; germanium; a compound semiconductor including silicon carbide, gallium arsenic, gallium phosphide, indium phosphide, indium arsenide, and/or indium antimonide; an alloy semiconductor including SiGe, GaAs, GaAsAl, GaAsP, GaN, InGaP, AlAs, InP, GaP, InGaN, and/or InAlN; or combinations thereof. In a particular embodiment, the carrier substrate 102 is a GaAs substrate.

Further, one or more etch stop layer(s) 106 are formed on the carrier substrate 102. In some embodiments, the etch stop layer(s) 106 are formed from a dielectric material, such as silicon carbide, silicon nitride, silicon oxynitride, or the like. In some embodiments, the etch stop layer(s) 106 are formed from a semiconductive material, such as InGaP, InP, GaAsAl, AlAs, or the like. The etch stop layer(s) 106 are selective to an etch process used to pattern subsequently formed reflective structures (see below), such that the carrier substrate 102 may be protected during the etching processes.

Further, a first reflective structure 108 is formed on the etch stop layer(s) 106. The first reflective structure 108 includes multiple layers of materials, such as dielectric or semiconductive materials. The layers may be doped or undoped. The layers may be deposited by a suitable deposition process, such as chemical vapor deposition (CVD), or may be grown by a suitable epitaxy process. The first reflective structure 108 may be a distributed Bragg reflector, which uses alternating layers of materials having different refractive indices to reflect light. In some embodiments, the first reflective structure 108 includes alternating doped and undoped layers of the material of the carrier substrate 102 (e.g., GaAs), with the doped layers having different refractive indices than the undoped layers. The dopant may be any dopant that allows the doped layers to have different refractive indices than the undoped layers. In some embodiments, the dopant is a p-type dopant such as carbon. In some embodiments, the doped layers of the first reflective structure 108 have a dopant concentration in the range of from about 1E15 atoms/cm$^3$ to about 1E21 atoms/cm$^3$. The first reflective structure 108 may thus form p-type reflecting regions in the resulting laser diodes.

Further, an emitting semiconductor region 110 is formed on the first reflective structure 108. The emitting semiconductor region 110 also includes a doped layer of the material of the carrier substrate 102 (e.g., GaAs). The emitting semiconductor region 110 has a p-type region and a n-type region, and forms a P-N junction that lases at a single resonant frequency during operation. The p-type region may be doped with p-type dopants such as boron, aluminum, gallium, indium, and the like. The n-type region may be doped with n-type dopants such as phosphorus, arsenic, and the like. In some embodiments, the p-type region is formed over the n-type region. The n-type region of the emitting semiconductor region 110 may be connected to the first reflective structure 108 such that light emits towards the first reflective structure 108.

Further, a second reflective structure 112 is formed on the emitting semiconductor region 110. The p-type region of the emitting semiconductor region 110 may be connected to the second reflective structure 112. The second reflective structure 112 includes multiple layers of materials, such as dielectric or semiconductive materials. The layers may be doped or undoped. The layers may be deposited by a suitable deposition process, such as CVD, or may be grown by a suitable epitaxy process. The second reflective structure 112 may be a distributed Bragg reflector, which uses alternating layers of materials having different refractive indices to reflect light. In some embodiments, the second reflective structure 112 includes alternating doped and undoped layers of the material of the carrier substrate 102 (e.g., GaAs), with the doped layers having different refractive indices than the undoped layers. The dopant may be any dopant that allows the doped layers to have different refractive indices than the undoped layers. In some embodiments, the dopant is a n-type dopant such as silicon. In some embodiments, the doped layers of the second reflective structure 112 have a dopant concentration in the range of from about 1E15 atoms/cm$^3$ to about 1E21 atoms/cm$^3$. The second reflective structure 112 may thus form n-type reflecting regions in the resulting laser diodes. The dopant of the second reflective structure 112 may be a different dopant than the dopant of the first reflective structure 108.

The reflective structures 108 and 112 form a resonant cavity, to help enhance the intensity of light from the emitting semiconductor region 110. The reflective structures 108 and 112 have different reflectivity, e.g., the refractive indices of the reflective structures 108 and 112 are different. In some embodiments, the first reflective structure 108 is formed to have a lower reflectivity than the second reflective structure 112, to allow emission of a laser beam from the emitting semiconductor region 110. The refractive indices of the reflective structures 108 and 112 may be varied by adjusting the overall height and overall doping amount of the reflective structures 108 and 112. For example, the height $H_1$ of the first reflective structure 108 may be less than the height $H_2$ of the second reflective structure 112. In some embodiments, the height $H_1$ is in the range of from about 1 μm to about 5 μm (such as about 3 μm), and the height $H_2$ is in the range of from about 1 μm to about 8 μm (such as about 6 μm).

Figure 2:
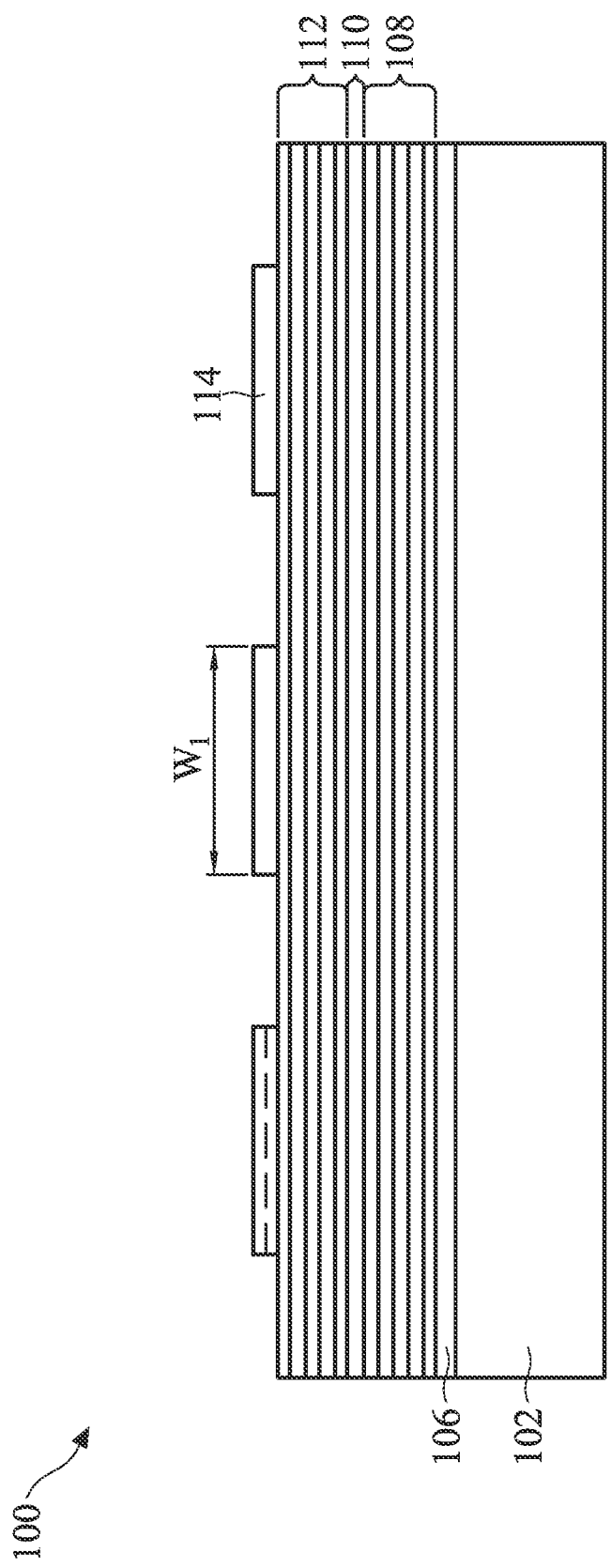

In FIG. 2, contact pads 114 are formed on the second reflective structure 112. The contact pads 114 are physically and electrically connected to the second reflective structure 112, which itself is physically and electrically connected to the emitting semiconductor region 110. The contact pads 114 thus connect to the n-type side of the laser diodes. The contact pads 114 may be a single layer, or may be a composite layer that includes multiple sub-layers (shown with a dashed line) formed of different materials. In some embodiments, the contact pads 114 are formed from Ge, Au, GeAu, Ni, Ti, Ta, Pt, Cu, Al, W, In, Ag, Sn, Zn, Pd, Mn, Sb, Be, Mg, Si, the like, or combinations thereof. In embodiments where the second reflective structure 112 is formed from n-type doped GaAs, the contact pads 114 may include at least a layer of Au, GeAu, or Ni. For example, the contact pads 114 may be a single layer of Au, GeAu, or Ni, or a composite layer with the bottommost sub-layer being an Au, GeAu, or Ni sub-layer and upper layer(s) being different conductive material(s). The contact pads 114 may be formed to any width $W_1$. In some embodiments, the width $W_1$ is in the range of from about 8 μm to about 28 μm (such as about 12 μm).

As an example to form the contact pads 114, a photoresist is formed and patterned over the second reflective structure 112. The photoresist may be formed by spin coating or the like and may be exposed to light for patterning. The pattern of the photoresist corresponds to the contact pads 114. The patterning forms openings through the photoresist to expose regions of the second reflective structure 112. A conductive material is formed in the openings of the photoresist and on the exposed portions of the second reflective structure 112. The conductive material may be formed by a deposition process, such as physical vapor deposition (PVD), electron-beam PVD, or the like. Then, the photoresist and excess portions of the conductive material are removed. The photoresist and excess portions of the conductive material may be removed by an acceptable lift-off process, such as ashing with an oxygen plasma or the like.

The contact pads 114 are referred to as ohmic contacts for the laser diodes. An ohmic contact for a semiconductive material is a contact that shares an ohmic metal-semiconductor junction with the semiconductive material. An ohmic metal-semiconductor junction has a constant ratio of current to voltage during operation. The materials of the second reflective structure 112 and contact pads 114 (in particular, their work functions) determine whether their metal-semiconductor junction is an ohmic junction or a Schottky junction. When the work function of the metal (e.g., contact pads 114) is less than the work function of the semiconductive material (e.g., second reflective structure 112), the junction is an ohmic junction. When the work function of the metal (e.g., contact pads 114) is greater than the work function of the semiconductive material (e.g., second reflective structure 112), the junction is a Schottky junction. The work function of the material(s) of the contact pads 114 is less than the work function of the material(s) of the second reflective structure 112.

Figure 3:
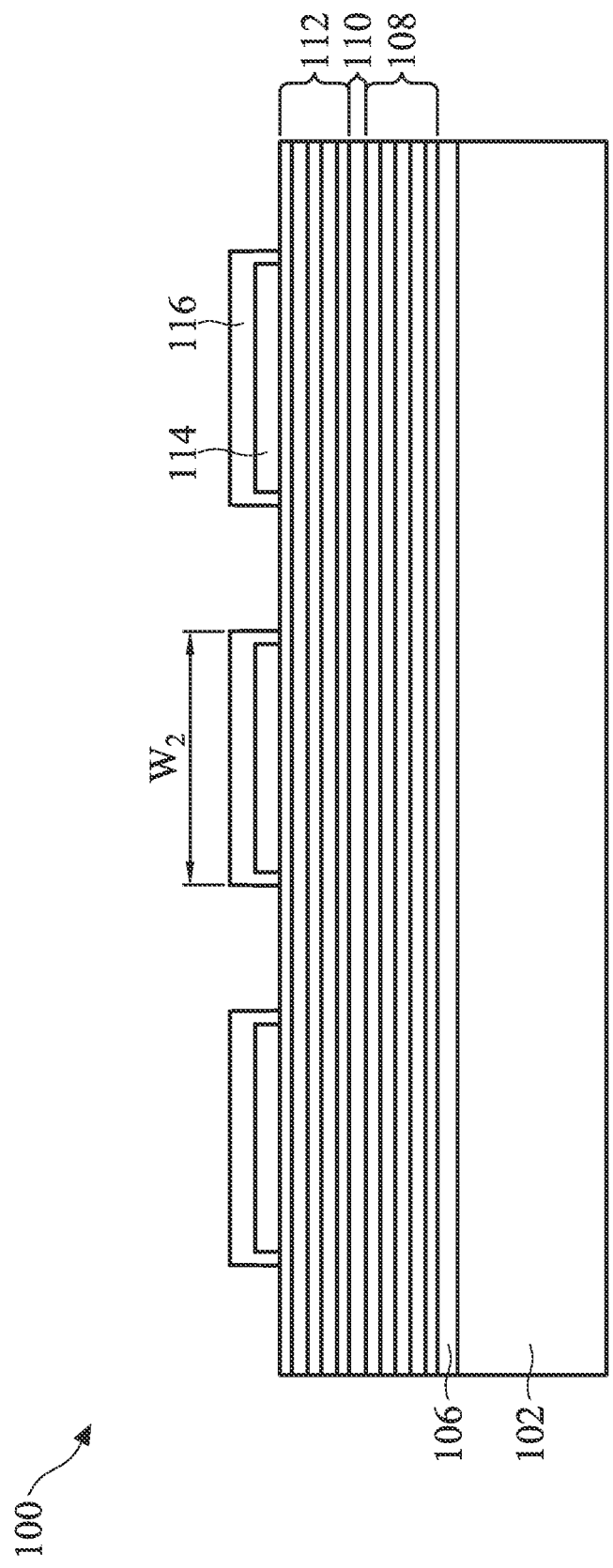

In FIG. 3, passivation features 116 are formed on the contact pads 114 and second reflective structure 112. The passivation features 116 protect the contact pads 114 and act as an etching mask during subsequent processing. The passivation features 116 may be formed to any width $W_2$. In some embodiments, the width $W_2$ is in the range of from about 10 µm to about 30 µm (such as about 13 µm). As an example to form the passivation features 116, a hardmask layer is formed on the contact pads 114 and second reflective structure 112. The hardmask layer may be formed from an inorganic material, which may be a nitride (such as silicon nitride), an oxide (such as silicon oxide or aluminum oxide), the like, or combinations thereof, and may be formed by a deposition process such as CVD, atomic layer deposition (ALD), or the like. In some embodiments, the hardmask layer is an oxide. A photoresist is then formed and patterned on the hardmask layer. The photoresist may be formed by spin coating or the like and may be exposed to light for patterning. The pattern of the photoresist corresponds to the passivation features 116. The patterning forms openings through the photoresist. The patterned photoresist is then used in an etching process, such as an anisotropic wet or dry etch, to pattern the hardmask layer, with remaining portions of the hardmask layer forming the passivation features 116. The photoresist may then be removed by an acceptable ashing or stripping process, such as using an oxygen plasma or the like.

Figure 4:
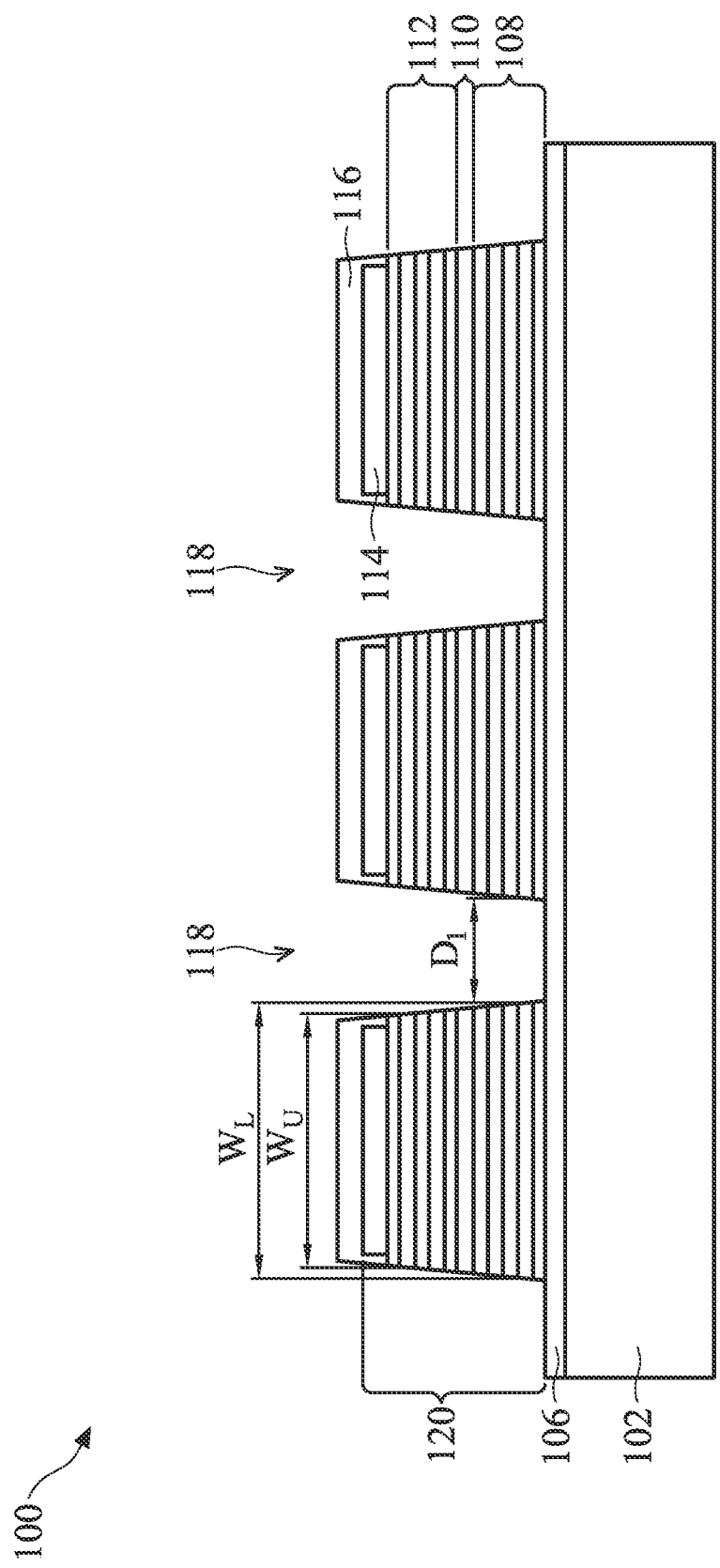

In FIG. 4, openings 118 are formed in the second reflective structure 112, emitting semiconductor region 110, and first reflective structure 108. The remaining mesas are referred to as laser diodes 120. The laser diodes 120 are PIN diodes. The openings 118 may be formed by an acceptable etching process using, for example, an anisotropic dry etch. The passivation features 116 are used as a mask during the etching process, and the etch stop layer(s) 106 are used to stop the etching process. A cleaning process may be performed to remove excess material after the etching process. For example, a wet etch using dilute hydrofluoric (dHF) acid may be performed to remove excess material.

The laser diodes 120 are spaced apart from one another by a distance $D_1$, which is determined by the widths of the openings 118. In some embodiments, the distance $D_1$ is in the range of from about 4 µm to about 100 µm. Further, the laser diodes 120 are formed with a tapered shape. Lower portions of the first reflective structures 108 have a lower width $W_L$, and upper portions of the second reflective structures 112 have an upper width $W_U$. In some embodiments, the lower width $W_L$ is in the range of from about 10 µm to about 30 µm (such as about 14 µm), and the upper width $W_U$ is in the range of from 12 µm to about 32 µm.

Figure 5:
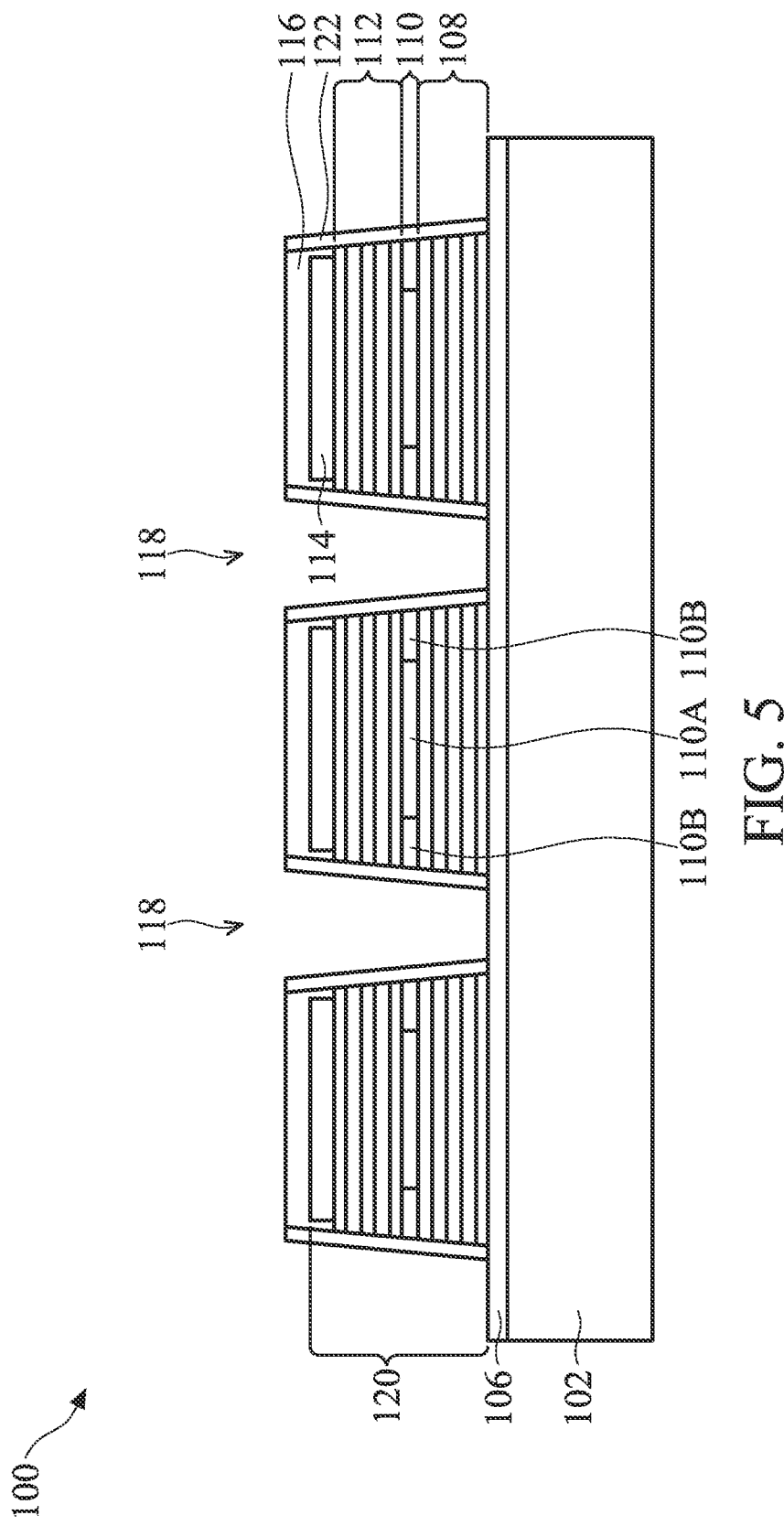

In FIG. 5, protective spacers 122 are formed on sides of the laser diodes 120. The protective spacers 122 may be formed from a dielectric material such as SiN, $SiO_x$, $Al_2O_3$, AlN, a combination thereof, or the like. The protective spacers 122 may be formed by a conformal deposition followed by an anisotropic etch. For example, a deposition process such as CVD, ALD, or the like may be used to deposit the protective spacers 122.

Further, opaque portions 110B are formed in the emitting semiconductor regions 110. The opaque portions 110B are at sides of the laser diodes 120, e.g., the opaque portions 110B extend around the perimeter of transparent portions 110A of the emitting semiconductor regions 110 in a top-down view. The opaque portions 110B substantially block or absorb light from the emitting semiconductor region 110, such that the light is not emitted from the resulting laser diodes in lateral direction (e.g., in a direction parallel to a major surface of the carrier substrate 102). The opaque portions 110B and reflective structures 108 and 112 form the resonant cavity of the laser diodes 120. The opaque portions 110B are oxidized material of the emitting semiconductor regions 110, and may be formed by a oxidation process such as a rapid thermal oxidation (RTO) process, a chemical oxidation process, a rapid thermal anneal (RTA) performed in an oxygen-containing environment, or the like.

Figure 6:
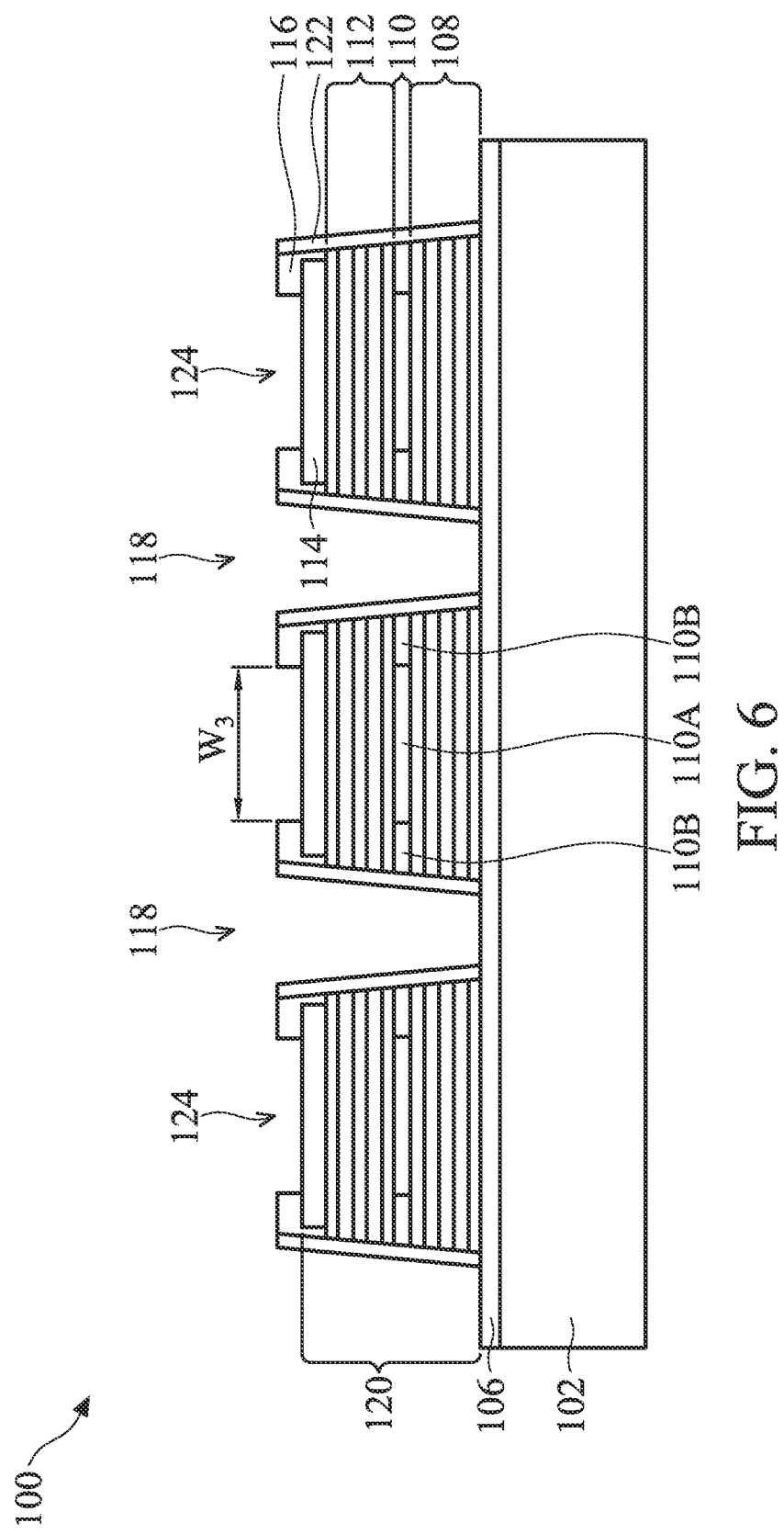

In FIG. 6, the passivation features 116 are patterned with openings 124 exposing the contact pads 114. The patterning may be by an acceptable process, such as by an etching process when the passivation features 116 are an oxide material. For example, a photoresist may be formed and patterned on the passivation features 116. The photoresist may be formed by spin coating or the like and may be exposed to light for patterning. The pattern of the photoresist corresponds to the passivation features 116. The patterning forms openings through the photoresist. The patterned photoresist is then used in an etching process, such as an anisotropic wet or dry etch, to form the openings 124 through the passivation features 116, exposing the contact pads 114. The openings 124 may be formed to any width $W_3$. In some embodiments, the width $W_3$ is in the range of from about 6 µm to about 26 µm (such as about 11 µm). The photoresist may then be removed by an acceptable ashing or stripping process, such as using an oxygen plasma or the like.

Figure 7:
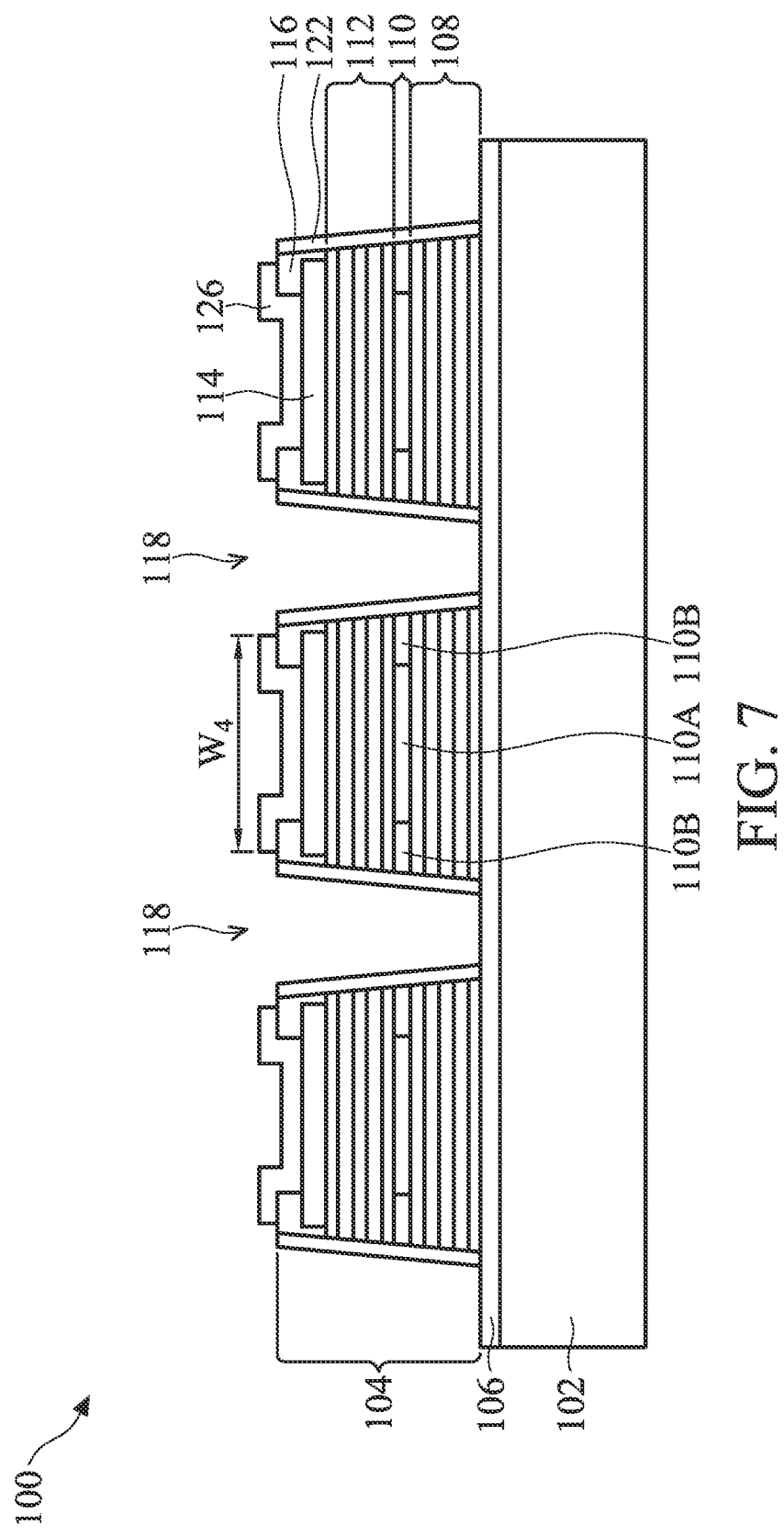

In FIG. 7, UBMs 126 are formed in the openings 124 of the passivation features 116. The UBMs 126 may be referred to as bonding metal layers or simply bonding layers, and are physically and electrically coupled to the contact pads 114. The UBMs 126 may be a single layer, or may be a composite layer that includes multiple sub-layers (shown with a dashed line) formed of different materials. In some embodiments, the UBMs 126 are formed from Ti, Ta, Ni, Cu, Sn, In, Au, Al, Pt, Pd, Ag, combinations thereof, or the like. In embodiments where the contact pads 114 are formed from Au, GeAu, or Ni, the UBMs 126 may include at least a Ti layer. For example, the UBMs 126 may be a single layer of Ti, or a composite layer with the bottommost sub-layer being a Ti sub-layer and upper layer(s) being different conductive material(s). The UBMs 126 may be formed to any width $W_4$. In some embodiments, the width $W_4$ is in the range of from about 8 µm to about 28 µm (such as about 12 µm).

As an example to form the UBMs 126, a photoresist is formed and patterned over the passivation features 116 and in the openings 118 and 124. The photoresist may be formed by spin coating or the like and may be exposed to light for patterning. The pattern of the photoresist corresponds to the UBMs 126. The patterning forms openings through the photoresist to expose the contact pads 114. A conductive material is formed in the openings of the photoresist and on the exposed portions of the contact pads 114. The conductive material may be formed by a deposition process, such as PVD, electron-beam PVD, or the like. Then, the photoresist and excess portions of the conductive material are removed. The photoresist and excess portions of the conductive material may be removed by an acceptable lift-off process, such as ashing with an oxygen plasma or the like.

The UBMs 126 are formed from different material(s) than the contact pads 114. In subsequent processing, conductive connectors such as solder connectors are formed connected to the UBMs 126. The UBMs 126 act as protective layers in the subsequent reflow processes, preventing metal inter-diffusion with the contact pads 114. The UBMs 126 are formed from a material that would form a Schottky junction if it were formed directly on the second reflective structure 112. In other words, the work function of the material(s) of the UBMs 126 is greater than the work function of the material(s) of the contact pads 114, and is also greater than the work function of the material(s) of the second reflective structure 112. Because the contact pads 114 and UBMs 126 share a metal-metal junction, no barrier is formed at the junction due to differences in the work functions of their material(s).

Figure 8:
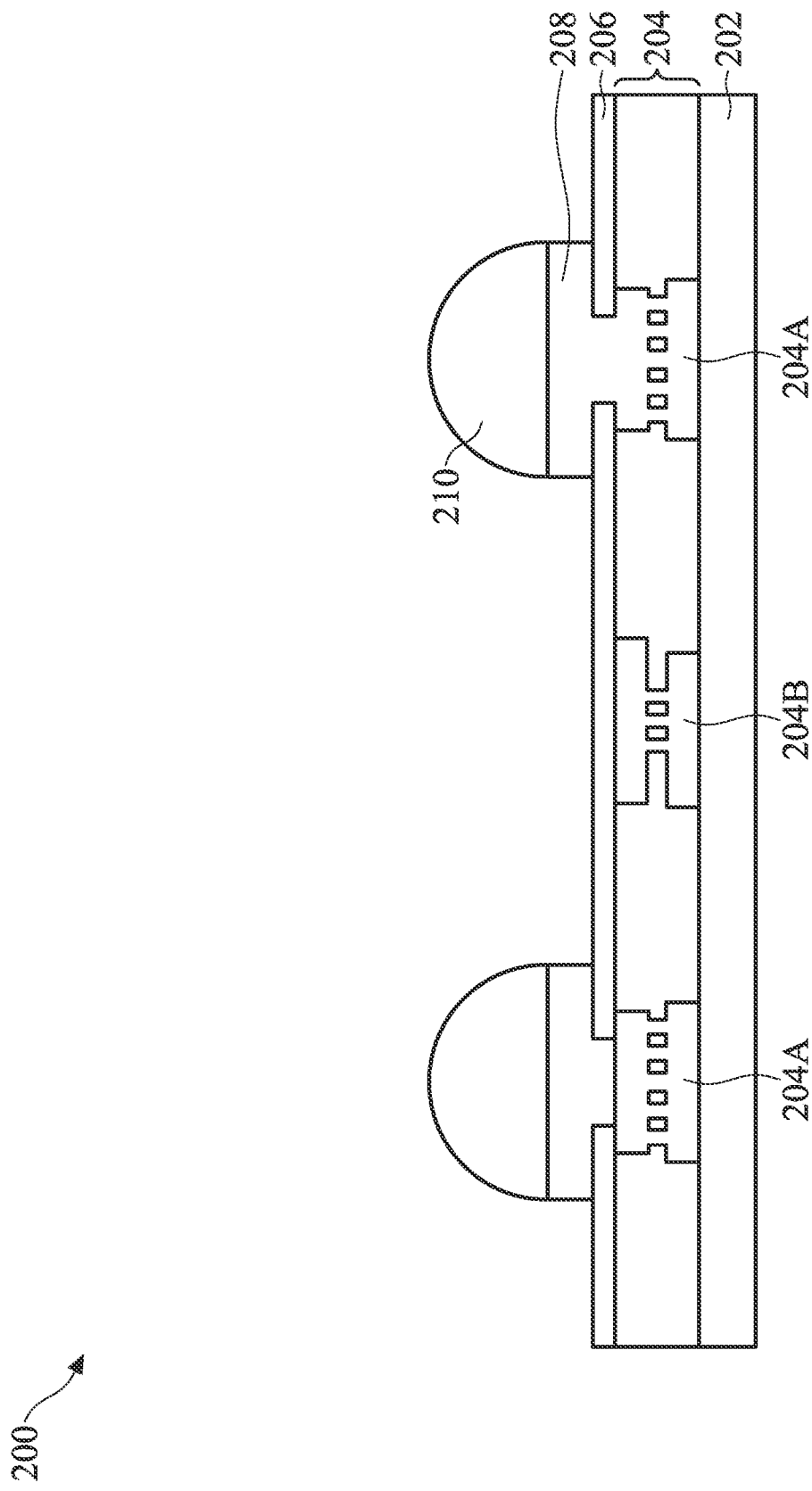
FIGS. 8 through 21 illustrate various cross-sectional view of a process for forming a laser device package, in accordance with some embodiments.

FIG. 8 illustrates a cross-sectional view of a second structure 200, in accordance with some embodiments. The second structure 200 may be a device such as an integrated circuit, an interposer, or the like. The second structure 200 includes a semiconductor substrate 202, with devices such as transistors, diodes, capacitors, resistors, etc., formed in and/or on the semiconductor substrate 202. The devices may be interconnected by an interconnect structure 204 formed by, for example, metallization patterns in one or more dielectric layers on the semiconductor substrate to form an integrated circuit. The metallization patterns of the interconnect structure 204 include pads 204A and 204B, which may, respectively, be used for coupling to the cathodes and anodes of the laser diodes. The metallization patterns may be formed from Cu, Al, or the like. A passivation layer 206 is formed over the interconnect structure 204 to protect the structure. The passivation layer 206 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, solder resist, polybenzoxazole (PBO), benzocyclobutene (BCB), molding compound, the like, or a combination thereof.

The second structure 200 further includes contact pads 208, such as aluminum or copper pads or pillars, to which external connections are made. The contact pads 208 are on what may be referred to as respective active sides of the second structure 200, and may be formed extending through the passivation layer 206 by, e.g., photolithography, etching, and plating processes. The contact pads 208 may be formed from a conductive material such as Cu, Ni, Ti, or the like. In some embodiments, the contact pads 208 are multilayered, e.g., the contact pads 208 include a copper layer on a nickel layer, with the copper layer and the nickel layer each being about 1 µm thick.

Conductive connectors 210 are formed on the contact pads 208. The conductive connectors 210 may be formed from a conductive material such as solder, copper, aluminum, gold, nickel, silver, palladium, tin, bismuth, the like, or a combination thereof. In some embodiments, the conductive connectors 210 are solder connections, such as lead-free solder. In some embodiments, the conductive connectors 210 are formed by initially forming a layer of solder on the contact pads 208 through methods such as evaporation, electroplating, printing, solder transfer, ball placement, or the like. Once a layer of solder has been formed on the contact pads 208, a reflow may be performed in order to shape the material into desired bump shapes. The conductive connectors 210 may have any height. In some embodiments, the conductive connectors 210 have a height of about 3 µm.

FIGS. 9 through 21 illustrate various cross-sectional view of a process for forming a laser device package 300, in accordance with some embodiments. The laser device package 300 may be packaged with a detector in further processing to form, e.g., an image sensor, a fiber optic networking device, or the like. The resulting device may be part of an integrated circuit device, such as a system-on-chip (SoC).

Figure 9:
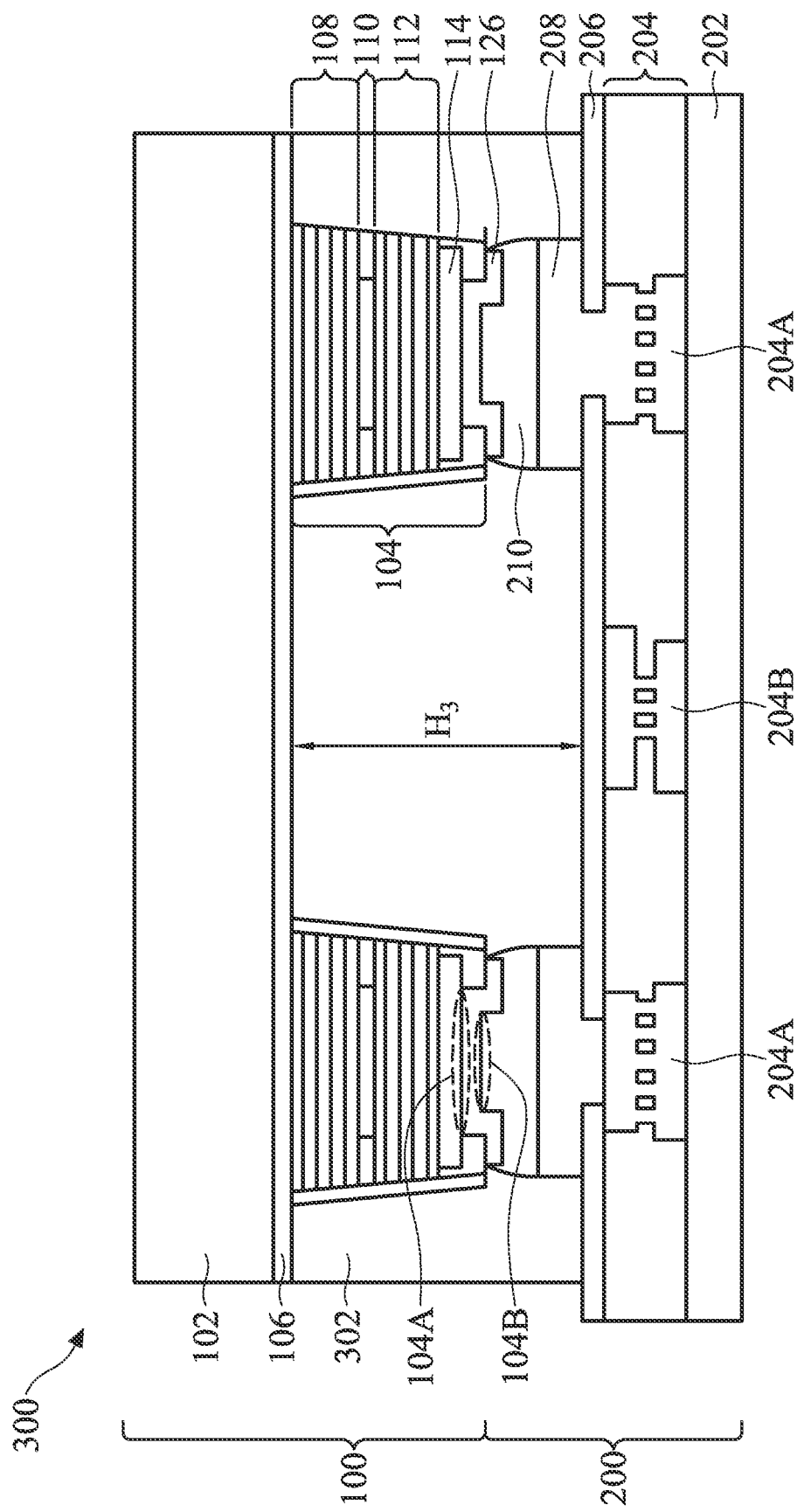

In FIG. 9, the first structure 100 is connected to the second structure 200. After the laser devices 104 are attached, the laser devices 104, conductive connectors 210, and portions of the contact pads 208 above the passivation layer 206 have a combined height $H_3$. In some embodiments, the combined height $H_3$ is in the range of from about 3 µm to about 35 µm (such as about 14 µm).

The laser devices 104 of the first structure 100 are connected to the contact pads 208 of the second structure 200 with the conductive connectors 210. The conductive connectors 210 may be contacted to the UBMs 126, and a reflow performed to physically and electrically couple the UBMs 126 and conductive connectors 210. The UBMs 126 act as protective layers during the reflow, preventing metal inter-diffusion between the conductive connectors 210 and contact pads 114. As a result, during the reflow, less metal inter-diffusion occurs at the interface 104A of the UBMs 126 and contact pads 114 than at the interface 104B of the UBMs 126 and conductive connectors 210. In some embodiments, an inter-metallic compound (IMC) may be formed at the interface 104B, but substantially no IMCs may be formed at the interface 104A (e.g., the interface of the UBMs 126 and the contact pads 114 may be substantially free from IMCs). By avoiding metal inter-diffusion with the contact pads 114, the junctions of the contact pads 114 and second reflective structures 112 retain their ohmic properties. In other words, the work function of the material(s) of the contact pads 114 is the same before and after the reflow.

When the first structure 100 is connected to the second structure 200, the second reflective structures 112 (e.g., n-type sides or cathodes) of the laser devices 104 face towards the second structure 200, and the first reflective structures 108 (e.g., p-type sides or anodes) of the laser devices 104 face towards the carrier substrate 102. Thus, the cathodes of the laser devices 104 are connected to the pads 204A of the interconnect structure 204. As noted above, the first reflective structures 108 have a lower reflectivity than the second reflective structures 112. As such, the produced laser beam from the emitting semiconductor region 110 is reflected by the second reflective structures 112. Some of the reflected laser beam is further reflected by the first reflective structure 108, and some is transmitted through the first reflective structure 108.

After the first structure 100 is connected to the second structure 200, an underfill 302 may be formed between the structures. The underfill 302 may be formed from a molding compound, an epoxy, or the like. The underfill 302 may not be cured, and is used as a temporary support for the second structure 200 during subsequent processing. Refraining from curing the underfill 302 may allow it to be more easily removed when subsequent processing is completed.

Figure 10:
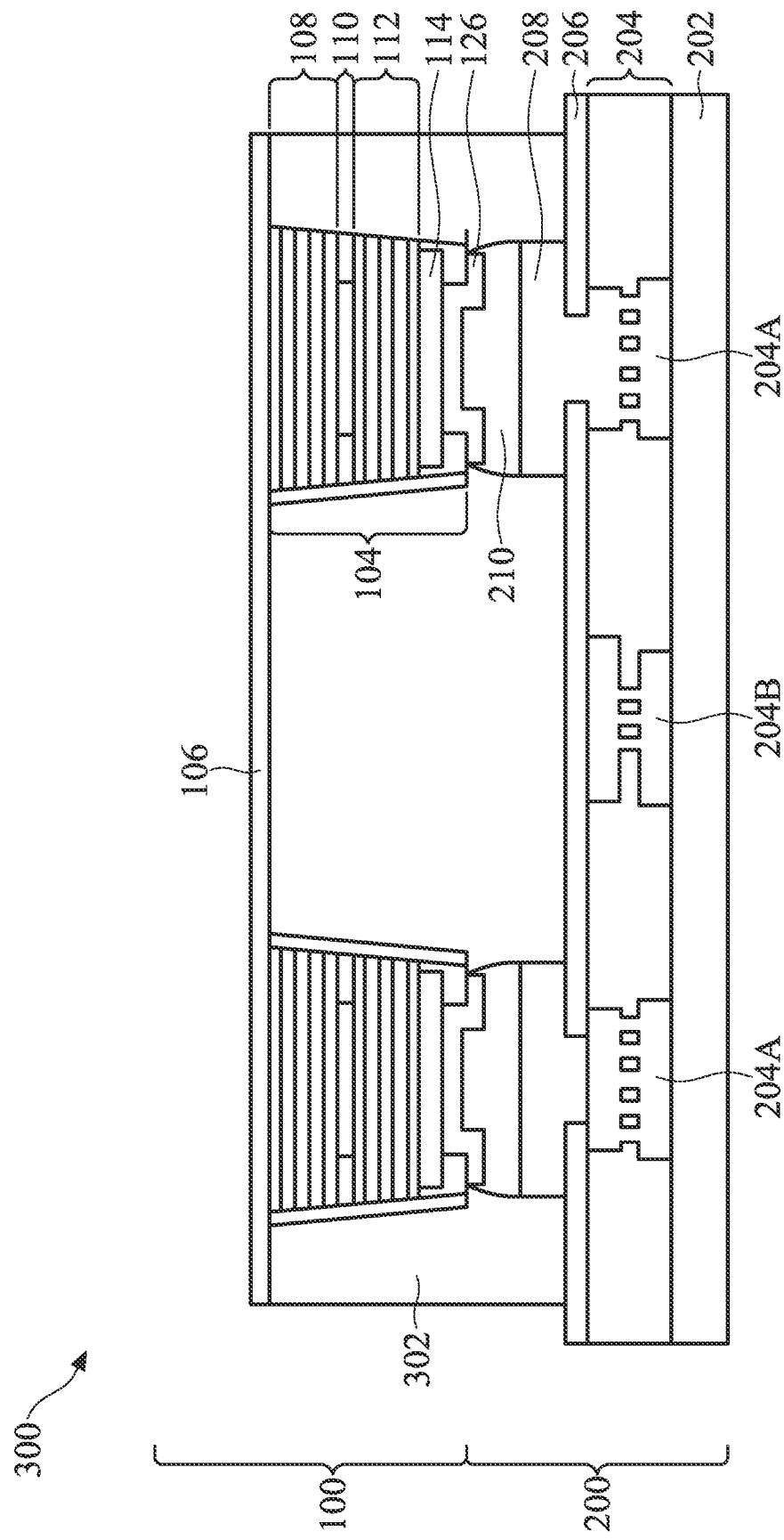

In FIG. 10, the carrier substrate 102 is removed, leaving behind the laser devices 104 and etch stop layer(s) 106. The carrier substrate 102 may be removed by an etching process, such as a wet etch that is selective to the material of the carrier substrate 102 (e.g., GaAs). The etch stop layer(s) 106 may stop the etching process. The underfill 302 supports the etch stop layer(s) 106, preventing them from collapsing during removal of the carrier substrate 102.

Figure 11:
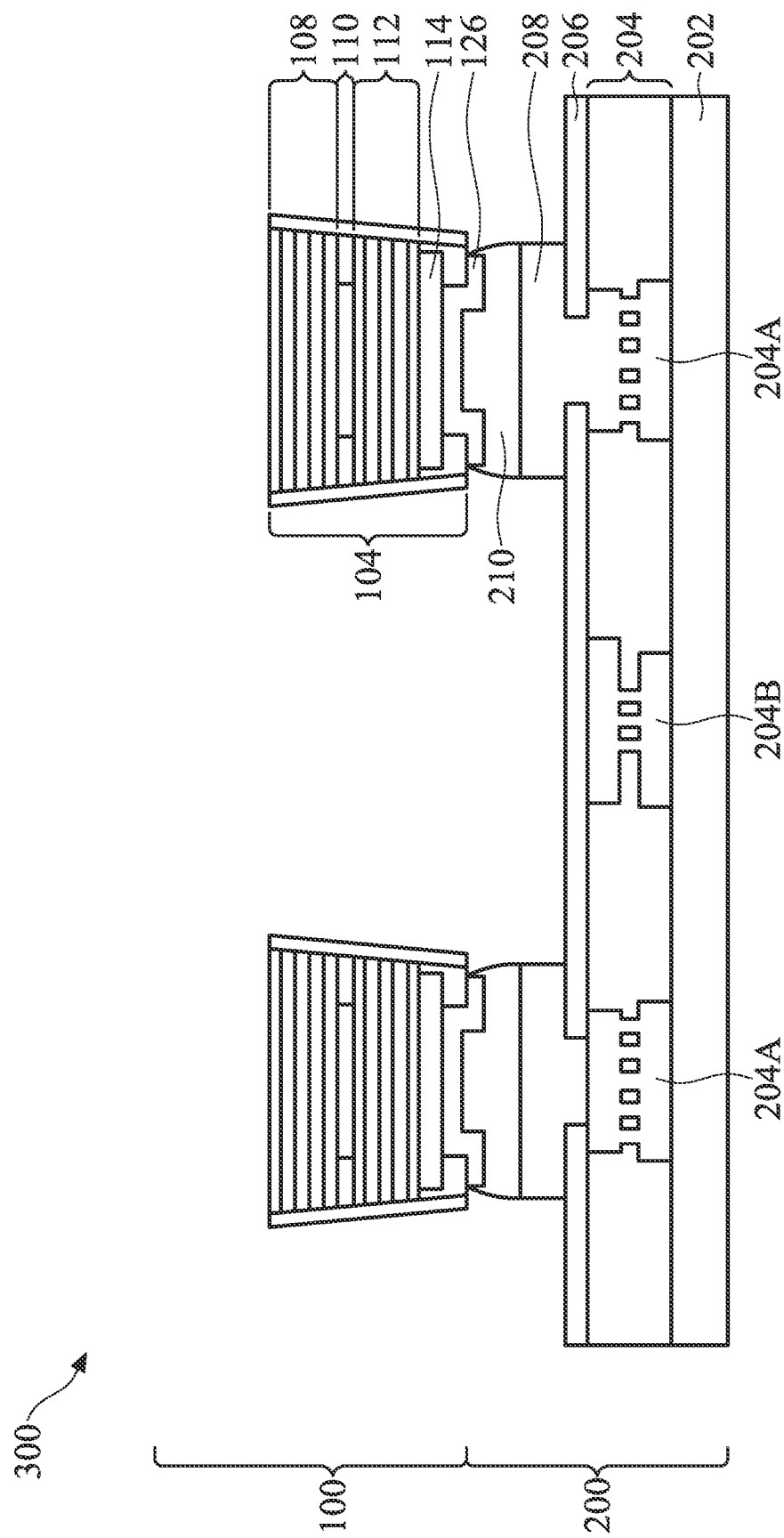

In FIG. 11, the etch stop layer(s) 106 are removed, leaving behind the laser devices 104. The etch stop layer(s) 106 may be removed by an etching process, such as a wet etch that is selective to the material of the carrier substrate 102 (e.g., GaAs). The underfill 302 is also removed, e.g., by an etching process such as a wet or dry etch. After the removal processes, the laser devices 104 remain.

Figure 12:
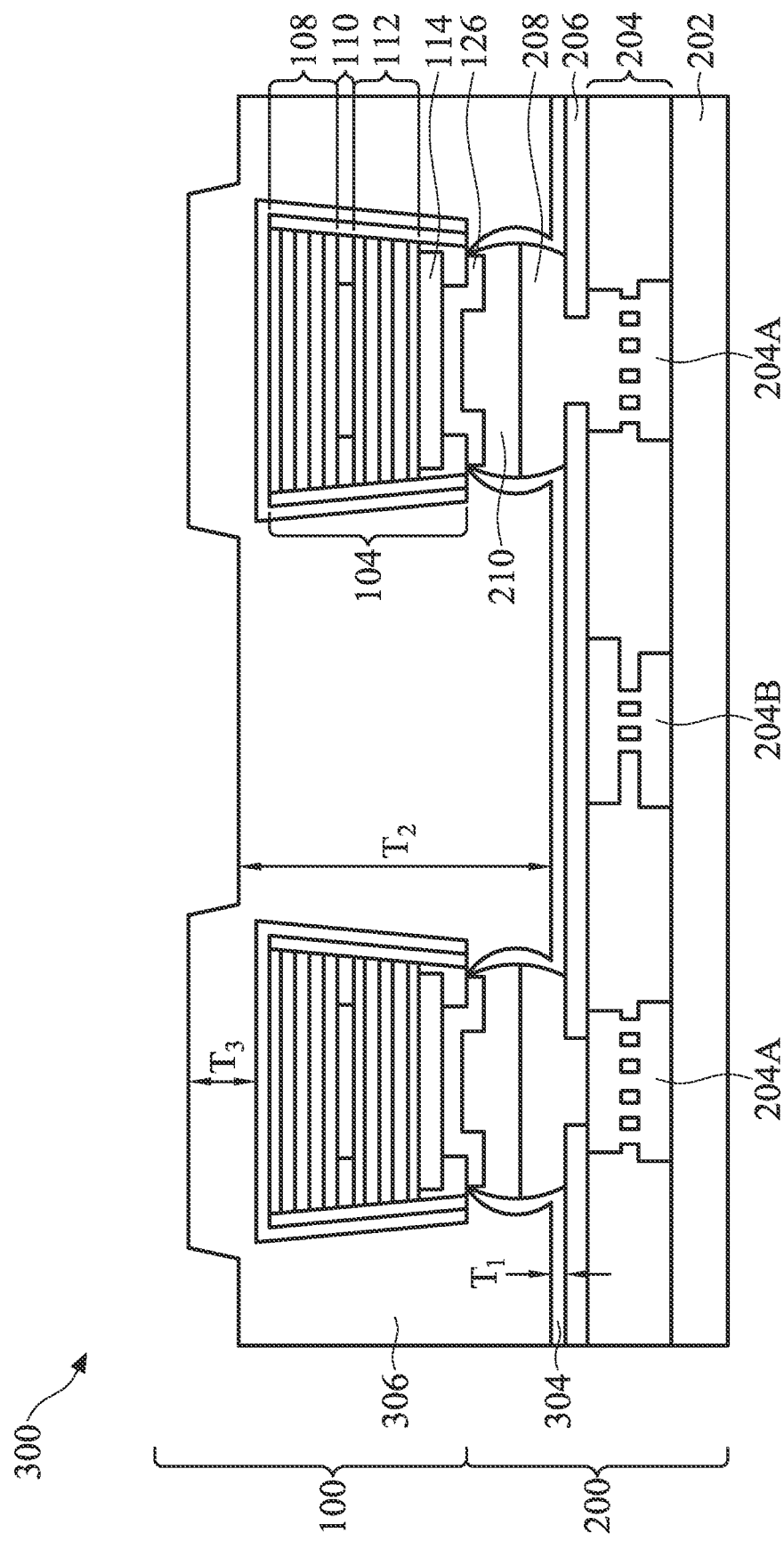

In FIG. 12, a passivation layer 304 is formed over the laser devices 104 and passivation layer 206. The passivation layer 304 also extends along sides of the contact pads 208 and conductive connectors 210. The passivation layer 304 may be formed from silicon oxide, silicon nitride, or the like, and may be formed by a deposition process such as CVD, ALD, or the like. In some embodiments, the passivation layer 304 is formed from an oxide (such as silicon oxide), and is formed by ALD. The passivation layer 304 is formed to a thickness $T_1$. In some embodiments, the thickness $T_1$ is in the range of from about 0.01 µm to about 0.5 µm.

Further, an isolation material 306 is formed over the passivation layer 304. The isolation material 306 may be formed from an oxide (such as silicon oxide), a polymer (such as a polyimide, a low temperature polyimide (LTPI), PBO, or BCB), or the like. In embodiments where the isolation material 306 is an oxide, it may be formed by a deposition process such as CVD, ALD, or the like. In embodiments where the isolation material 306 is a polymer, it may be formed by a coating process such as spin coating. The isolation material 306 is formed to a thickness $T_2$, which is greater than the thickness $T_1$ of the passivation layer 304. In some embodiments, the thickness $T_2$ is in the range of from about 3 µm to about 100 µm. The isolation material 306 surrounds and buries the laser devices 104. Portions of the isolation material 306 over the laser devices 104 have a thickness $T_3$. In some embodiments, the thickness $T_3$ is less than or equal to about 65 µm.

Figure 13:
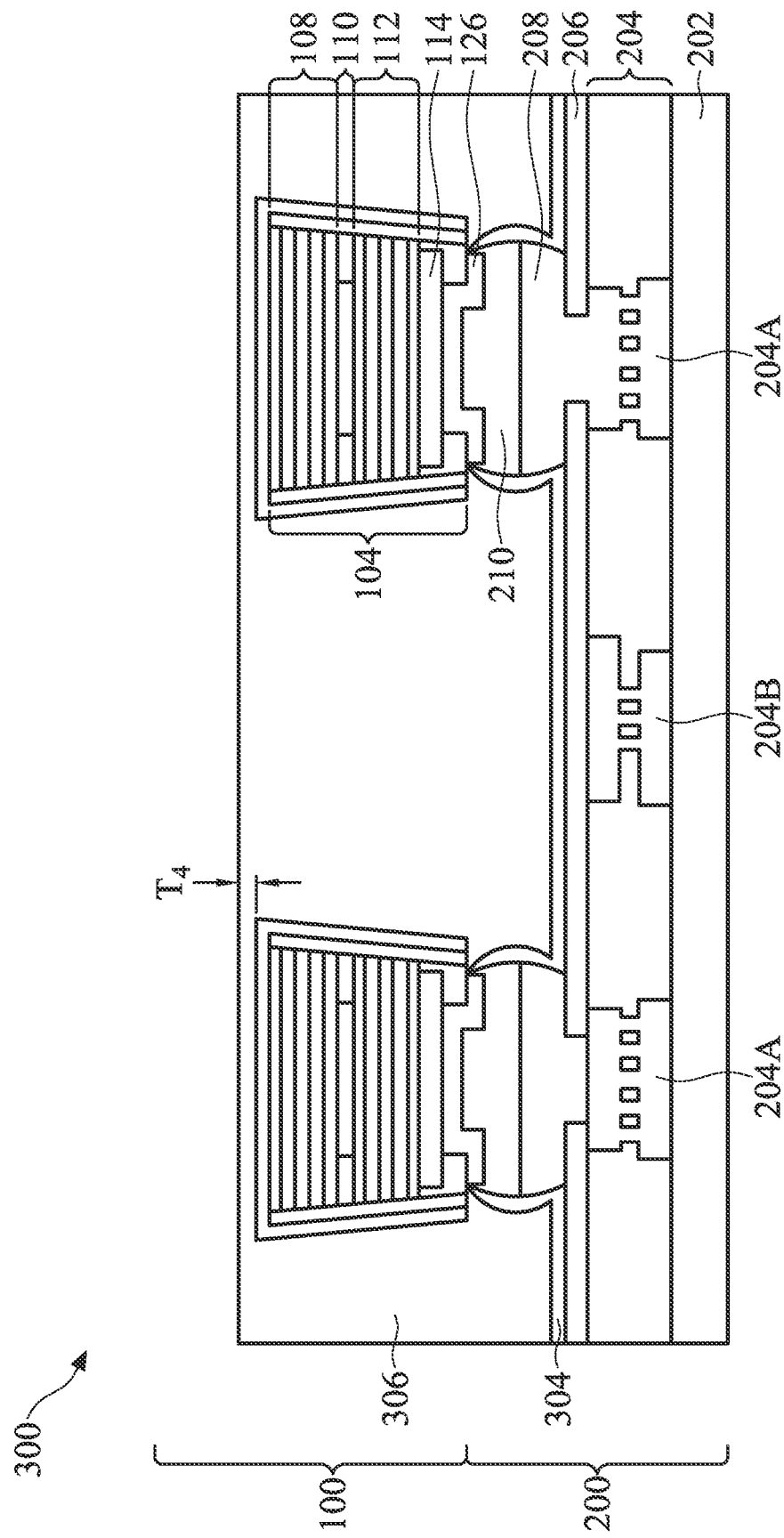

In FIG. 13, a planarization process is performed to planarize and thin the isolation material 306. In particular, the amount of isolation material 306 over the laser devices 104 is reduced. The planarization process may be, e.g., a grinding process, a chemical-mechanical polish (CMP) process, or the like. After planarization and thinning, portions of the isolation material 306 over the laser devices 104 have a reduced thickness $T_4$, which is less than the thickness $T_3$. In some embodiments, the reduced thickness $T_4$ is less than or equal to about 5 µm (such as about 1 µm).

Figure 14:
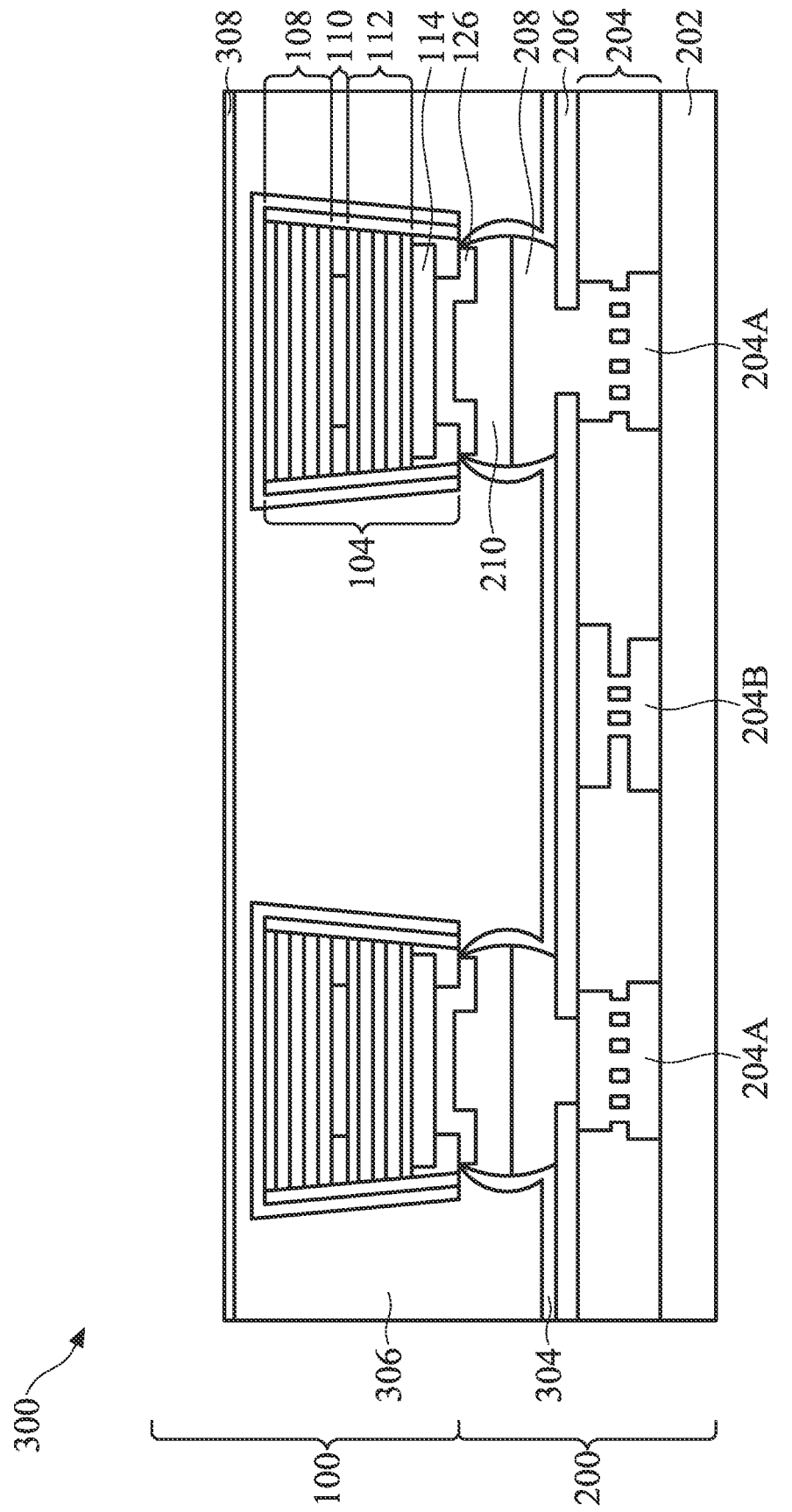

In FIG. 14, a mask layer 308 is formed on the isolation material 306. In some embodiments, the mask layer 308 is formed from a metal or a metal-containing material such as Ti, Cu, TiW, TaN, TiN, combinations thereof, or multilayers thereof. In some embodiments, the mask layer 308 is formed from a dielectric material such as SiC or the like. The mask layer 308 may be referred to as a hardmask layer. The mask layer 308 may be formed by a deposition process such as PVD, CVD, or the like.

Figure 15:
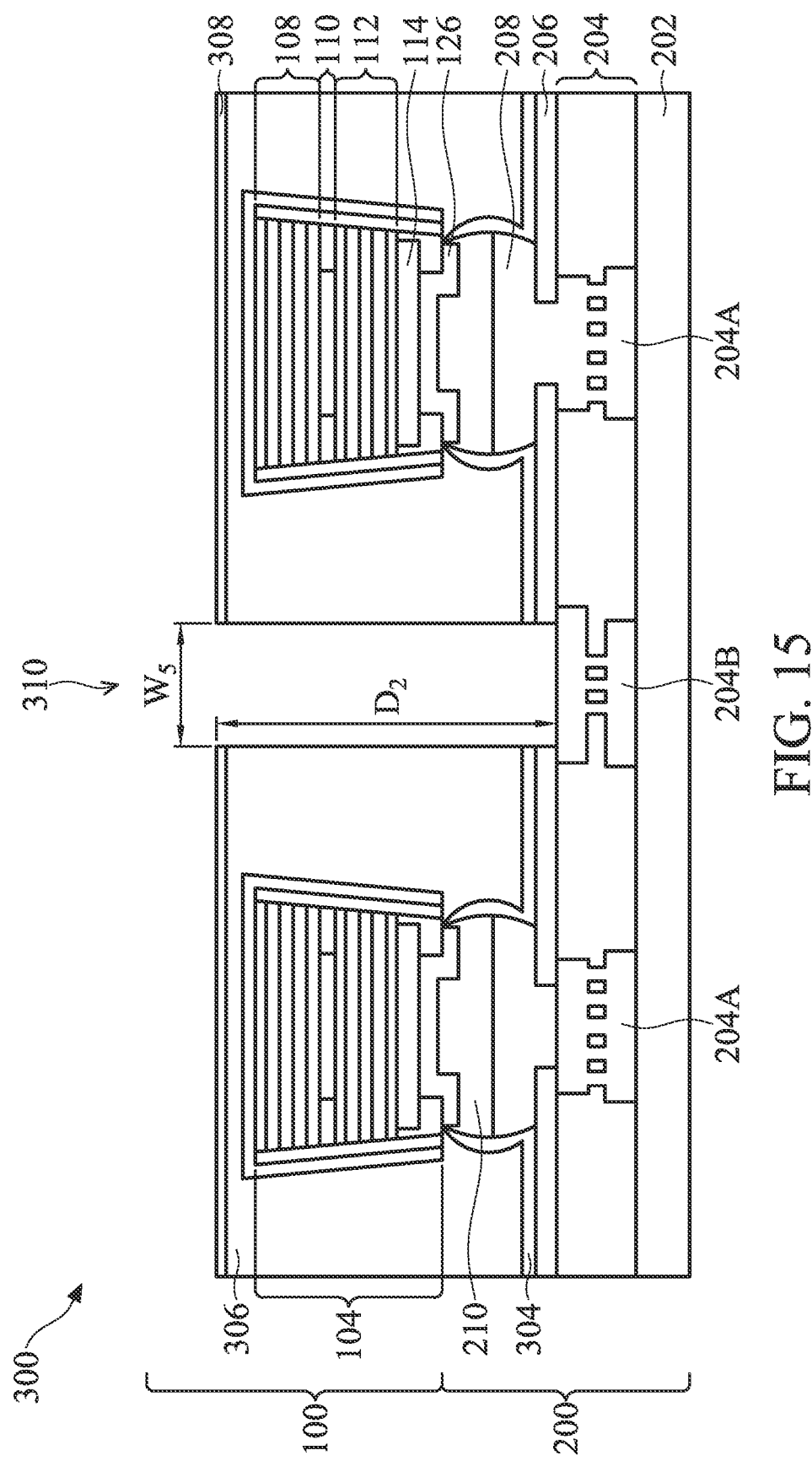

In FIG. 15, openings 310 are formed in the mask layer 308, isolation material 306, passivation layer 304, and passivation layer 206. The pads 204B of the interconnect structure 204 are exposed by the openings 310. The openings 310 may be formed by a two-step etching process, where the mask layer 308 is patterned in a first etching process, and the pattern of the mask layer 308 is transferred to underlying features in a second etching process. As an example to the two-step etching process, a photoresist is formed and patterned over the mask layer 308. The photoresist may be formed by spin coating or the like and may be exposed to light for patterning. The pattern of the photoresist corresponds to the openings 310. The mask layer 308 is patterned by transferring the pattern of the photoresist to the mask layer 308. The mask layer 308 may be patterned by an acceptable etching process, such as by wet etching, dry etching, or a combination thereof, using the patterned photoresist as an etching mask. The isolation material 306, passivation layer 304, and passivation layer 206 are then patterned by transferring the pattern of the mask layer 308 to underlying features. The isolation material 306, passivation layer 304, and passivation layer 206 may be patterned by an acceptable etching process, such as by dry etching, plasma etching, or a combination thereof, using the patterned mask layer 308 as an etching mask. In some embodiments, the mask layer 308 may be removed before subsequent processing is performed. In the embodiment shown, the mask layer 308 remains, and is removed after subsequent processing steps are performed.

The openings 310 may be formed to any width $W_5$. The two-step etching process allows the width $W_5$ of the openings 310 to have a small critical dimension. In some embodiments, the width $W_5$ is in the range of from about 1 µm to about 80 µm (such as about 3 µm). Further, the openings 310 may be formed to any depth $D_2$. In some embodiments, the depth $D_2$ is in the range of from about 3 µm to about 41 µm (such as about 14 µm). The two-step etching process allows the depth-to-width ratio of the openings 310 to be large. In some embodiments, the depth-to-width ratio of the openings 310 is in the range of from about 40:1 to about 2:1.

Figure 16:
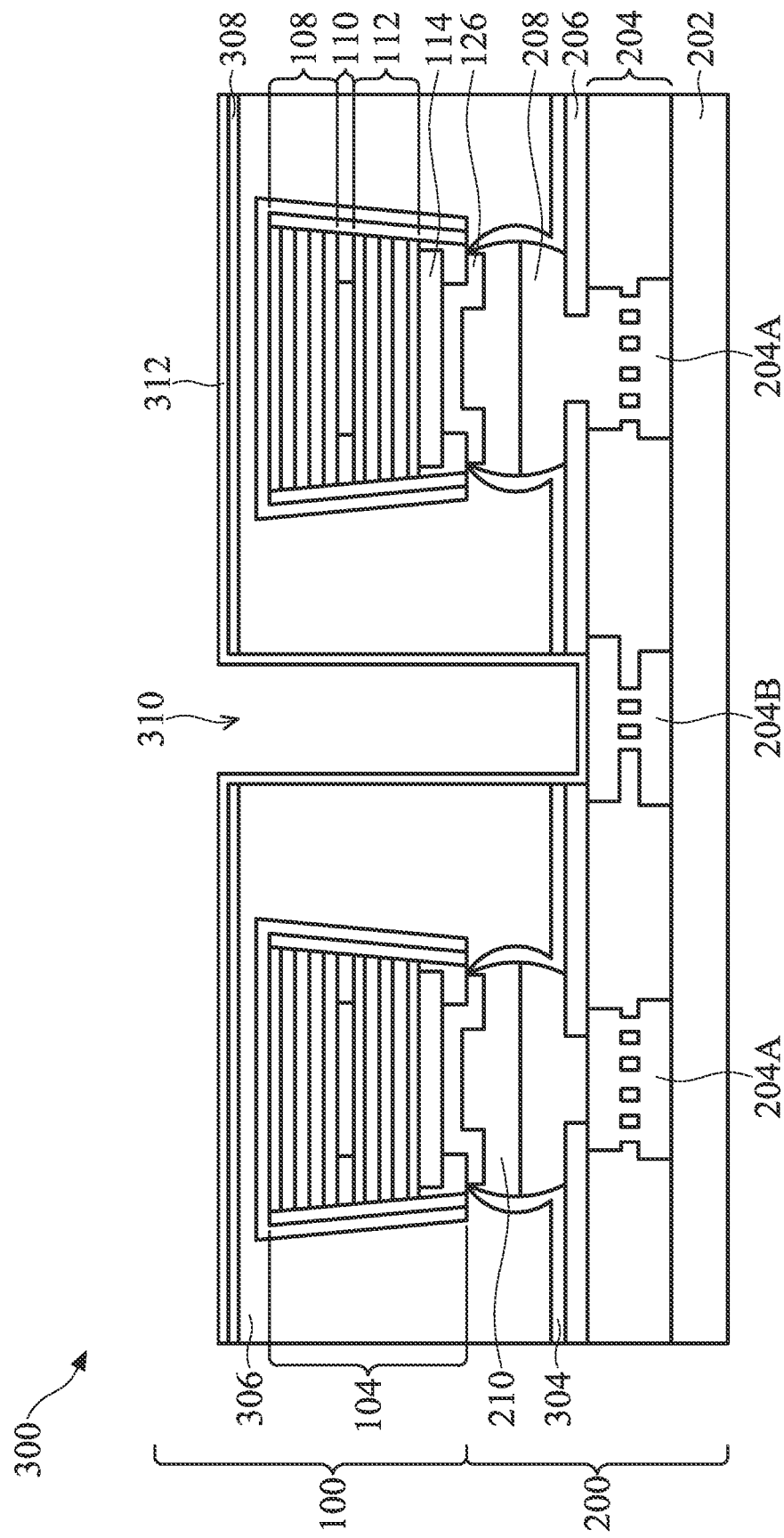

In FIG. 16, a seed layer 312 is formed in the openings 310 and on the pads 204B of the interconnect structure 204. In embodiments where the mask layer 308 remains, the seed layer 312 also extends along the mask layer 308. The seed layer 312 is a metal layer, which may be a single layer or a composite layer including a plurality of sub-layers formed of different materials. In some embodiments, the seed layer 312 includes a titanium layer and a copper layer over the titanium layer. The seed layer 312 may be formed by a deposition process such as PVD or the like. A barrier layer may also be formed over the seed layer 312. The barrier layer may be formed from TaN, TiN, or the like, and may be formed by a deposition process such as PVD or the like.

Figure 17:
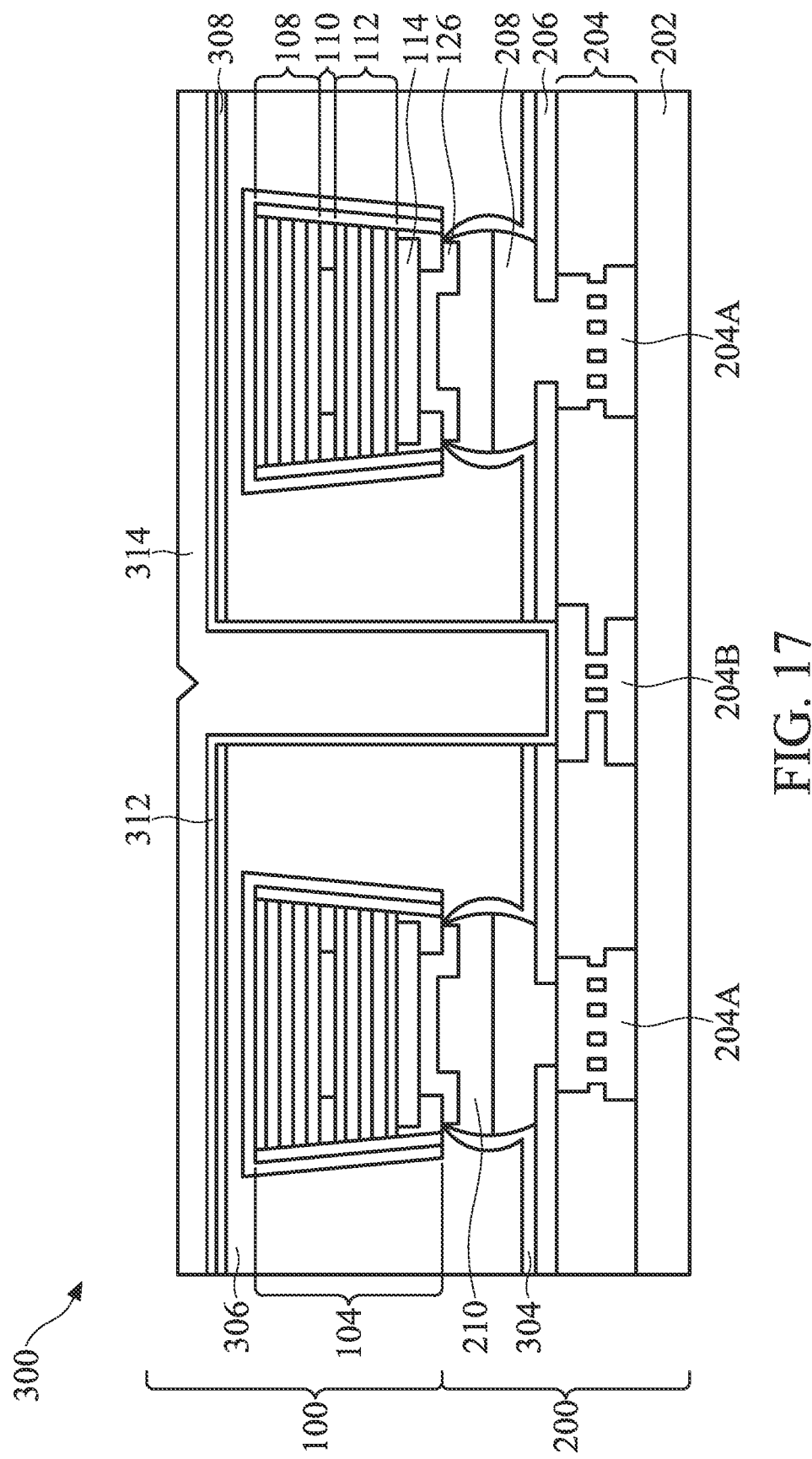

In FIG. 17, a conductive material 314 is formed on the seed layer 312 and in the openings 310. The conductive material 314 may be a metal such as copper, tungsten, aluminum, titanium, or the like. The conductive material 314 may be formed by plating, such as electroplating or electroless plating, or the like.

Figure 18:
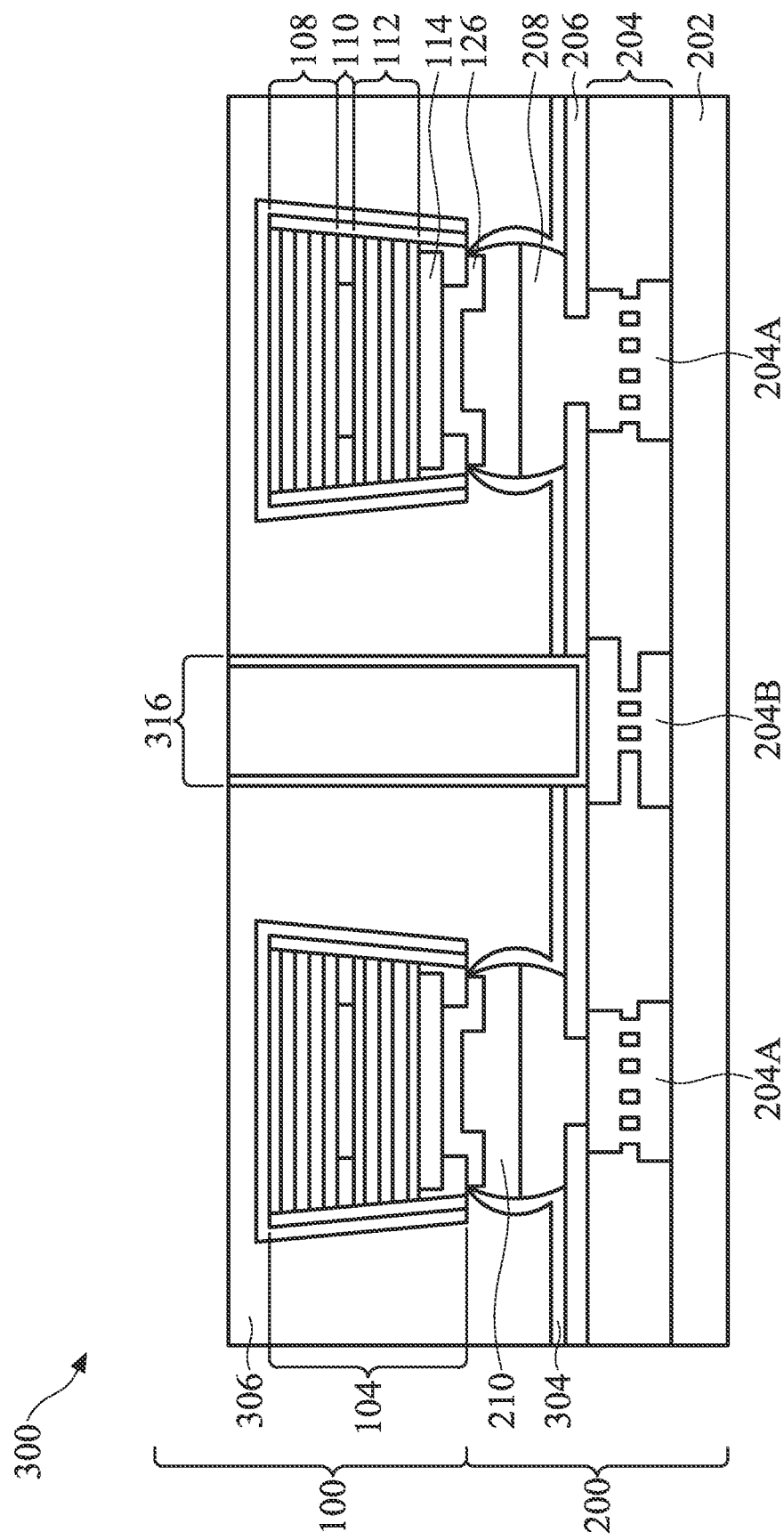

In FIG. 18, a planarization process is performed to planarize the conductive material 314 and isolation material 306. The planarization process may be, e.g., a grinding process, a CMP process, or the like. Remaining portions of the conductive material 314 and seed layer 312 form conductive vias 316 in the openings 310. The conductive vias 316 are physically and electrically connected to the pads 204B of the interconnect structure 204.

Figure 19:
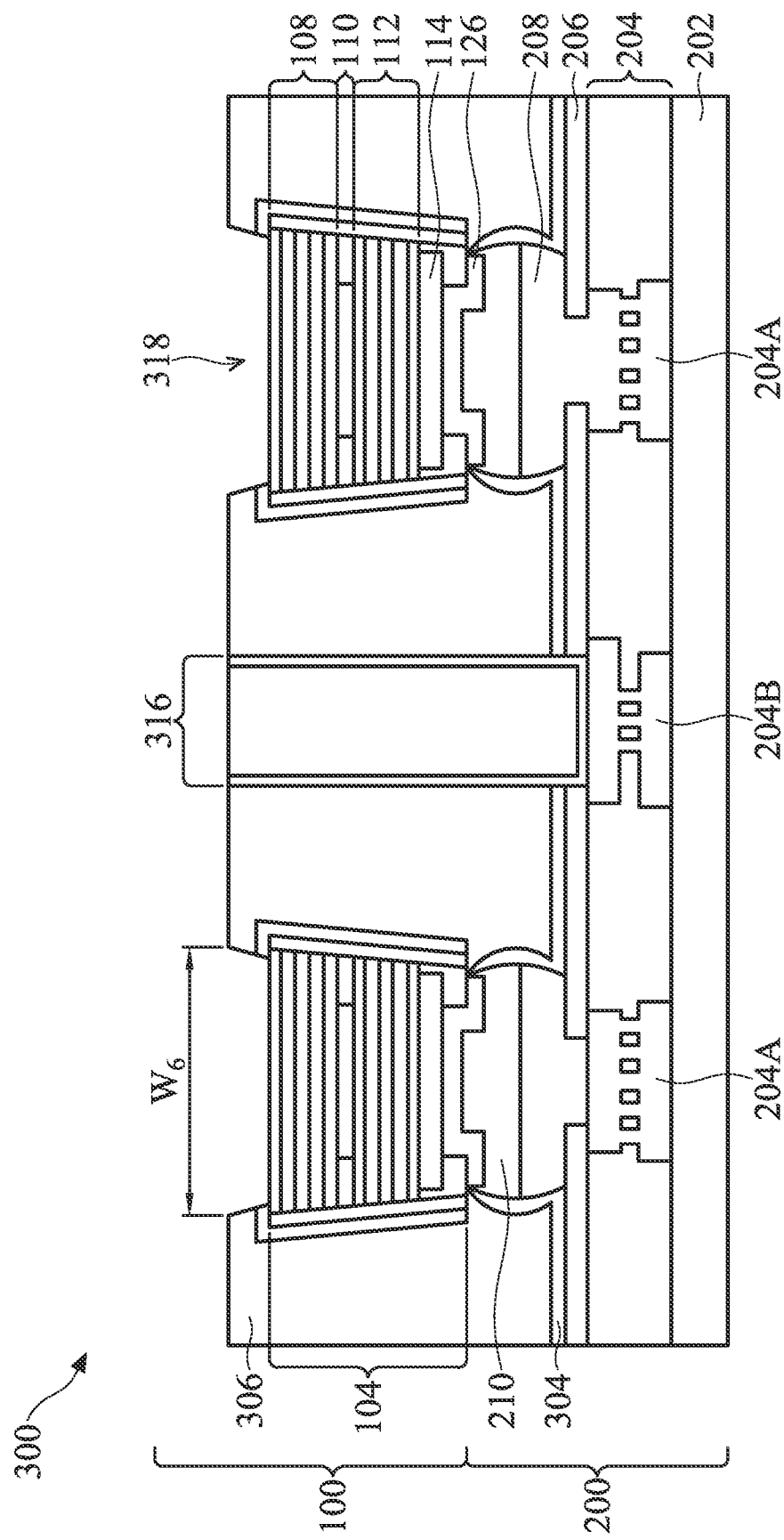

In FIG. 19, openings 318 are formed in the isolation material 306 and passivation layer 304, exposing the laser devices 104. The openings 318 may be formed by acceptable photolithography and etching techniques. For example, a photoresist may be formed and patterned over the isolation material 306. The photoresist may be formed by spin coating or the like and may be exposed to light for patterning. The pattern of the photoresist corresponds to the openings 318. The isolation material 306 and passivation layer 304 are patterned by transferring the pattern of the photoresist to the isolation material 306 and passivation layer 304. The openings 318 are shallower than the openings 310, and so use of an additional hardmask during the etching may be avoided. The isolation material 306 and passivation layer 304 may be patterned by an acceptable etching process, such as by dry etching, using the patterned photoresist as an etching mask. The openings 318 may be formed to any width $W_6$. In some embodiments, the width $W_6$ is in the range of from about 10 µm to about 30 µm (such as about 13 µm).

Figure 20:
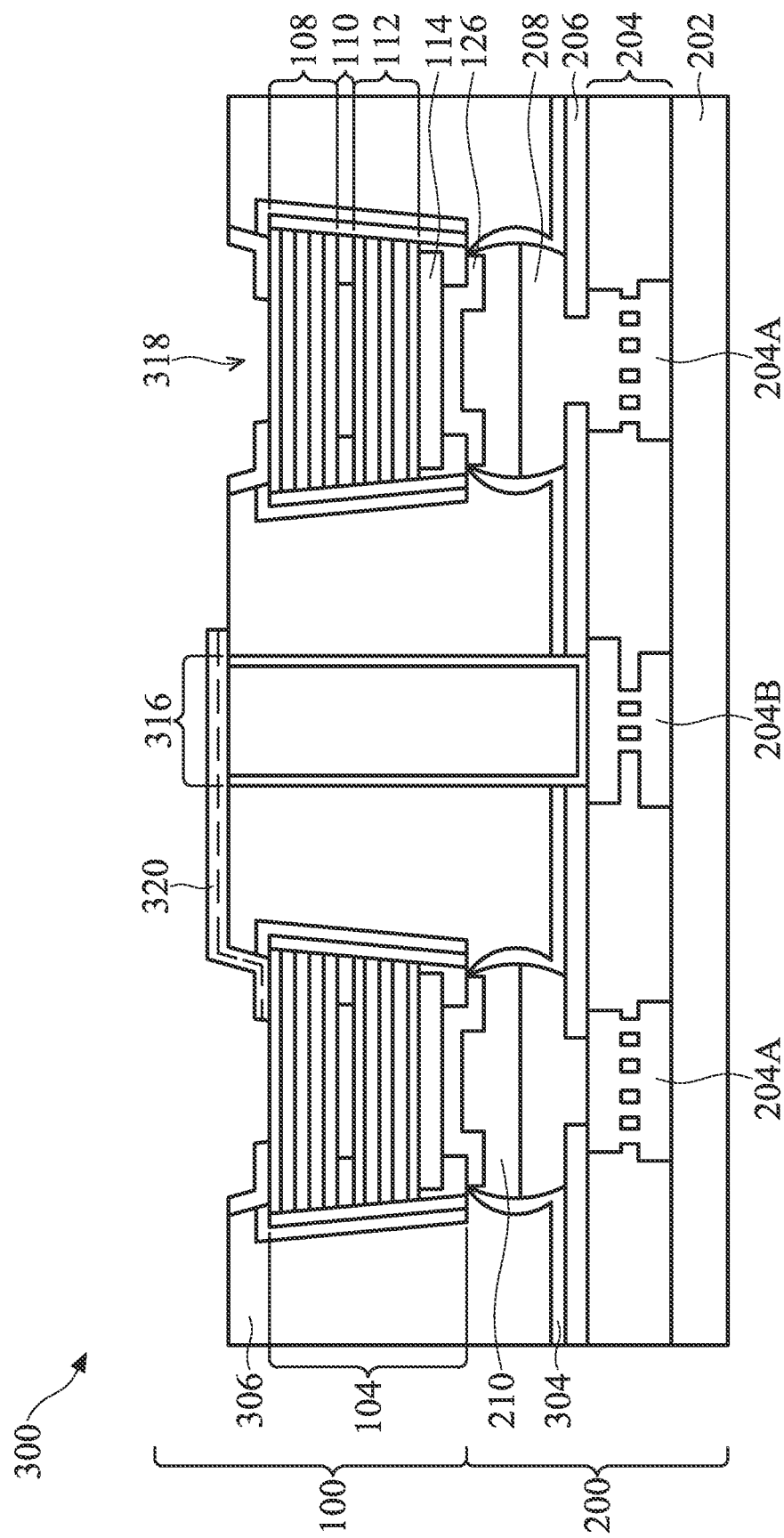

In FIG. 20, electrodes 320 are formed in the openings 318 and along the top surface of the isolation material 306, thereby forming contacts for the first reflective structures 108 of the laser devices 104. In addition to being contacts for the first reflective structures 108 of the laser devices 104, the electrodes 320 connect the laser devices 104 to the conductive vias 316. Thus, the pads 204A of the interconnect structure 204 are electrically connected to the second reflective structures 112 (e.g., cathodes) through the conductive connectors 210, and the pads 204B of the interconnect structure 204 are electrically connected to the first reflective structures 108 (e.g., anodes) through the electrodes 320 and conductive vias 316.

Like the contact pads 114, the electrodes 320 are formed of a material that allows the metal-semiconductor junction of the electrodes 320 and first reflective structures 108 to be ohmic. The electrodes 320 may be a single layer, or may be a composite layer that includes multiple sub-layers (shown with a dashed line) formed of different materials. In some embodiments, the electrodes 320 are formed from Ti, Pt, Au, Cu, Al, Ni, combinations thereof, or the like. In embodiments where the first reflective structures 108 are formed from p-type doped GaAs, the electrodes 320 may include at least a Ti or Pt layer. For example, the electrodes 320 may be a single layer of Ti or Pt, or a composite layer with the bottommost sub-layer being a Ti or Pt sub-layer and upper layer(s) being different conductive material(s).

As an example to form the electrodes 320, a photoresist is formed and patterned over the isolation material 306 and laser devices 104. The photoresist may be formed by spin coating or the like and may be exposed to light for patterning. The pattern of the photoresist corresponds to the electrodes 320. The patterning forms openings through the photoresist to expose the first reflective structures 108. A conductive material is formed in the openings of the photoresist and on the exposed portions of the first reflective structures 108. The conductive material may be formed by a deposition process, such as PVD, electron-beam PVD, or the like. Then, the photoresist and excess portions of the conductive material are removed. The photoresist and excess portions of the conductive material may be removed by an acceptable lift-off process, such as ashing with an oxygen plasma or the like.

Figure 21:
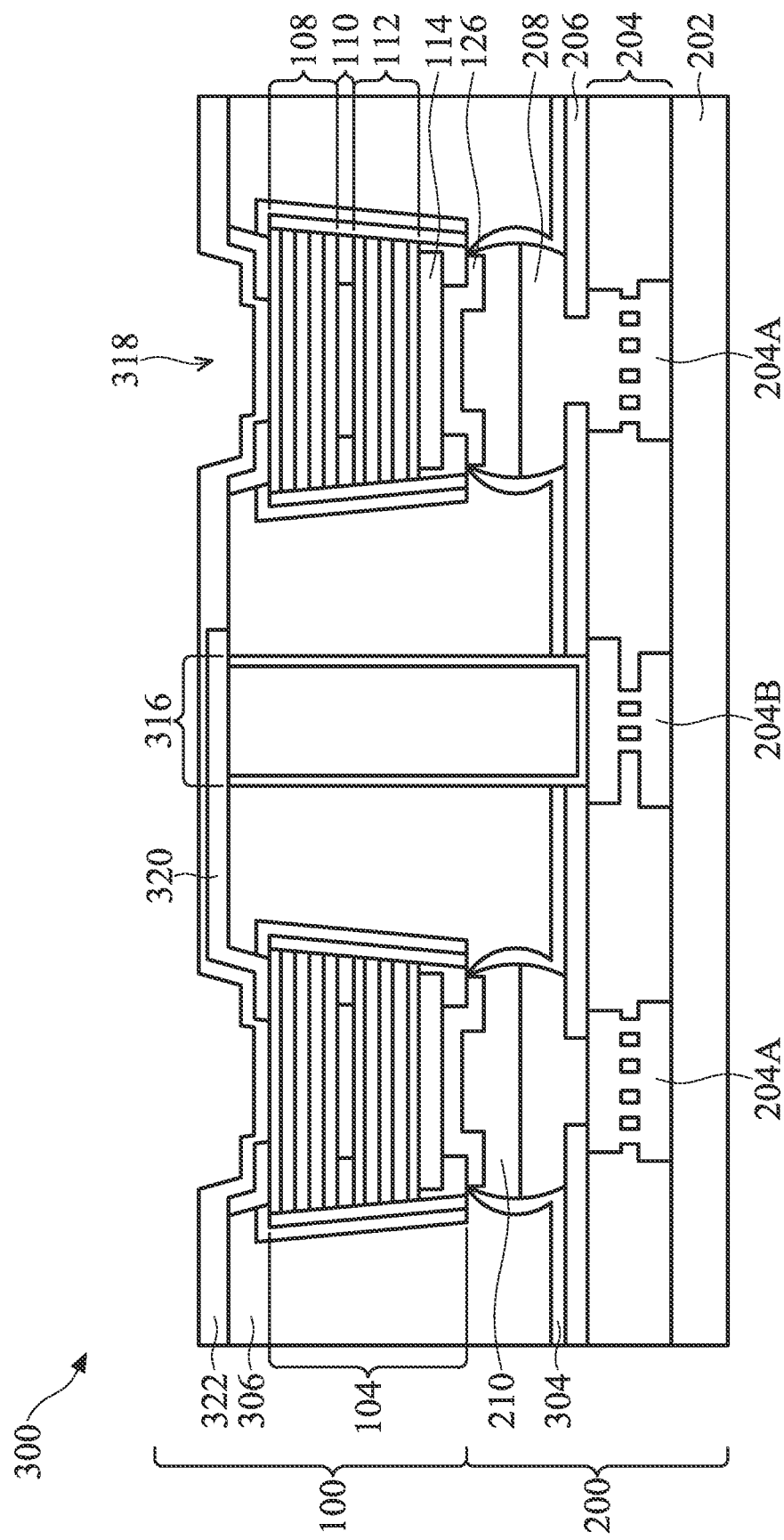

In FIG. 21, a passivation layer 322 is formed over the electrodes 320 and isolation material 306. The passivation layer 322 may be formed from silicon oxide, silicon nitride, or the like, and may be formed by a deposition process such as CVD. In some embodiments, the passivation layer 322 is formed from a nitride (such as silicon nitride).

Figure 22:
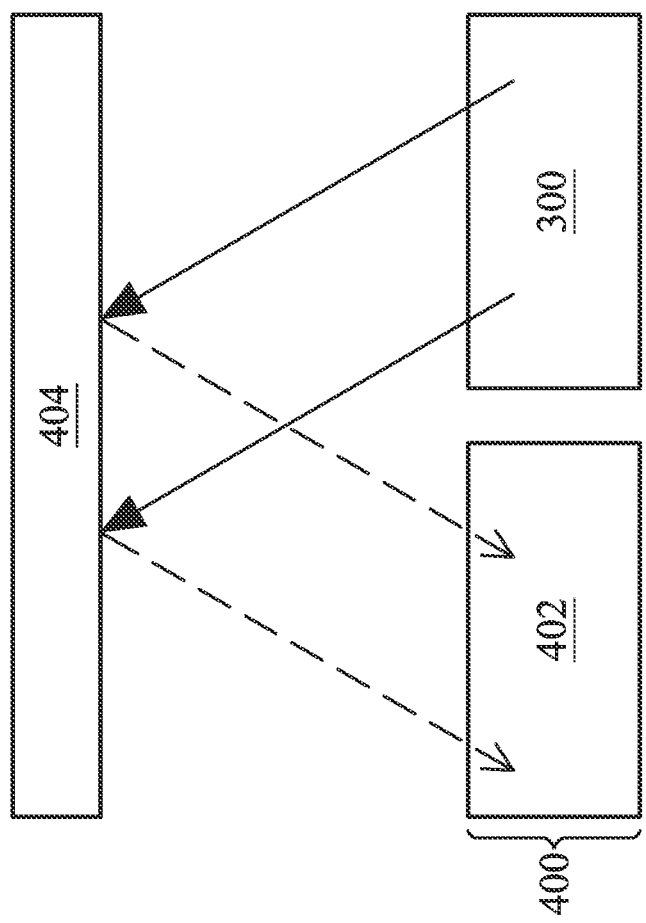
FIG. 22 illustrates operation of a laser device package, in accordance with some embodiments.

FIG. 22 illustrates operation of the laser device package 300, in accordance with some embodiments. The laser device package 300 may be used as a laser beam source for a depth sensor 400. Laser beam(s) may be generated by the laser devices 104 of the laser device package 300 in pulses, and may be received by a detector 402 after being reflected by a target 404. A round trip time for the laser beam(s) may be measured and used to calculate the distance between the depth sensor 400 and the target 404. The detector 402 may be, e.g., a CMOS image sensor such as a photodiode. In some embodiments, the detector 402 is formed on a same substrate as the laser device package 300. For example, the detector 402 may be formed in the semiconductor substrate 202 of the second structure 200 (see FIG. 8).

Embodiments may achieve advantages. By selecting a desirable material for the contact pads 114, the metal-semiconductor junction of the second reflective structure 112 and contact pads 114 may be ohmic (or at least may have a lower Schottky barrier). By forming the UBMs 126 between the contact pads 114 and conductive connectors 210, metal inter-diffusion between the contact pads 114 and conductive connectors 210 may be avoided. The junctions of the contact pads 114 and second reflective structures 112 may thus retain their ohmic properties when reflowing the conductive connectors 210. The contact resistance of the contact pads 114 may thus be reduced, and the quality and/or reliability of the resulting joint may be increased.

In an embodiment, a device includes: a first reflective structure including first doped layers of a semiconductive material, alternating ones of the first doped layers being doped with a p-type dopant; a second reflective structure including second doped layers of the semiconductive material, alternating ones of the second doped layers being doped with a n-type dopant; an emitting semiconductor region disposed between the first reflective structure and the second reflective structure; a contact pad on the second reflective structure, a work function of the contact pad being less than a work function of the second reflective structure; a bonding layer on the contact pad, a work function of the bonding layer being greater than the work function of the second reflective structure; and a conductive connector on the bonding layer.

In some embodiments, the device further includes: a passivation feature on the second reflective structure and the contact pad, the bonding layer extending through the passivation feature. In some embodiments of the device, the semiconductive material is GaAs. In some embodiments of the device, the contact pad is a single layer of Au, GeAu, or Ni. In some embodiments of the device, the contact pad includes: a first sub-layer on the second reflective structure, the first sub-layer being Au, GeAu, or Ni; and a second sub-layer on the first sub-layer, the second sub-layer being a different conductive material than the first sub-layer. In some embodiments of the device, the bonding layer is a single layer of Ti. In some embodiments of the device, the bonding layer includes: a first sub-layer on the contact pad, the first sub-layer being Ti; and a second sub-layer on the first sub-layer, the second sub-layer being a different conductive material than the first sub-layer. In some embodiments, the device further includes: an interconnect structure including a first pad and a second pad, the first pad being connected to the conductive connector; a conductive via connected to the second pad; an electrode connecting the conductive via to the first reflective structure; and a passivation layer on the electrode. In some embodiments, the device further includes: an isolation material surrounding the conductive via, the first reflective structure, and the second reflective structure, the electrode being disposed on the isolation material.

In an embodiment, a method includes: forming a first reflective structure on a substrate, the first reflective structure including first doped layers of a semiconductive material, alternating ones of the first doped layers being doped with a p-type dopant; forming an emitting semiconductor region on the first reflective structure; forming a second reflective structure on the emitting semiconductor region, the second reflective structure including second doped layers of the semiconductive material, alternating ones of the second doped layers being doped with a n-type dopant; depositing a contact pad on the second reflective structure, a work function of the contact pad being less than a work function of the second reflective structure; depositing a bonding layer on the contact pad, a work function of the bonding layer being greater than the work function of the second reflective structure; forming a conductive connector on the bonding layer; and reflowing the conductive connector.

In some embodiments, the method further includes: forming a passivation feature on the second reflective structure and the contact pad; and patterning an opening in the passivation feature, the bonding layer being deposited in the opening. In some embodiments, the method further includes: etching the second reflective structure, the emitting semiconductor region, and the first reflective structure using the passivation feature as an etching mask, where after the etching, remaining portions of the second reflective structure, the emitting semiconductor region, and the first reflective structure form a laser diode, the laser diode having an upper width and a lower width, the upper width being less than the lower width. In some embodiments, the method further includes: oxidizing the laser diode, the oxidizing forming an opaque portion of the emitting semiconductor region at sides of the laser diode.

In an embodiment, a method includes: contacting a laser device to a conductive connector, the laser device including: a laser diode including a doped semiconductive material, the laser diode having an anode and a cathode; a contact pad on the cathode of the laser diode, the contact pad and the laser diode having an ohmic junction; and a bonding layer on the contact pad, the conductive connector being contacted to the bonding layer; reflowing the conductive connector, where during the reflowing, an inter-metallic compound is formed at an interface of the bonding layer and the conductive connector, and no inter-metallic compounds are formed at an interface of the bonding layer and the contact pad; forming an isolation material around the laser device and the conductive connector; forming a conductive via through the isolation material; and forming an electrode connecting the conductive via to the anode of the laser diode.

In some embodiments, the method further includes: after contacting the laser device to the conductive connector, forming an underfill around the laser device; and before forming the isolation material, removing the underfill. In some embodiments of the method, forming the conductive via includes: forming a mask layer on the isolation material; patterning the mask layer with a first opening; transferring the first opening of the mask layer to the isolation material; forming a conductive material in the first opening; and planarizing the conductive material and the isolation material, remaining portions of the conductive material forming the conductive via. In some embodiments of the method, forming the electrode includes: forming an opening in the isolation material, the opening exposing the anode of the laser diode; and depositing the electrode in the opening, along a top surface of the isolation material, and along the conductive via. In some embodiments of the method, depositing the electrode includes: depositing a single layer of Ti or Pt. In some embodiments of the method, depositing the electrode includes: forming a first sub-layer, the first sub-layer being Ti or Pt; and forming a second sub-layer on the first sub-layer, the second sub-layer being a different conductive material than the first sub-layer. In some embodiments, the method further includes: depositing a passivation layer on the electrode and the isolation material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first reflective structure comprising first doped layers of a semiconductive material, alternating ones of the first doped layers being doped with a p-type dopant;
   a second reflective structure comprising second doped layers of the semiconductive material, alternating ones of the second doped layers being doped with an n-type dopant;
   an emitting semiconductor region disposed between the first reflective structure and the second reflective structure;
   a contact pad on the second reflective structure, a work function of the contact pad being less than a work function of the second reflective structure;
   a bonding layer on the contact pad, a work function of the bonding layer being greater than the work function of the second reflective structure;
   a conductive connector on the bonding layer;
   an interconnect structure comprising a first pad and a second pad, the conductive connector physically contacting the first pad;
   a conductive via physically contacting the second pad;
   an isolation material surrounding the conductive via, the first reflective structure, and the second reflective structure;
   an electrode on and extending through the isolation material, the electrode connecting the conductive via to the first reflective structure; and
   a first passivation layer physically contacting a sidewall of the conductive connector, the isolation material being disposed on the first passivation layer.

2. The device of claim 1, further comprising:
   a passivation feature on the second reflective structure and the contact pad, the bonding layer extending through the passivation feature.

3. The device of claim 1, wherein the semiconductive material is GaAs.

4. The device of claim 3, wherein the contact pad is a single layer of Au, GeAu, or Ni.

5. The device of claim 3, wherein the contact pad comprises:
   a first sub-layer on the second reflective structure, the first sub-layer comprising Au, GeAu, or Ni; and
   a second sub-layer on the first sub-layer, the second sub-layer comprising a different conductive material than the first sub-layer.

6. The device of claim 3, wherein the bonding layer is a single layer of Ti.

7. The device of claim 3, wherein the bonding layer comprises:
   a first sub-layer on the contact pad, the first sub-layer comprising Ti; and
   a second sub-layer on the first sub-layer, the second sub-layer comprising a different conductive material than the first sub-layer.

8. The device of claim 1, wherein the conductive via comprises:
   a seed layer on the second pad and sidewalls of the isolation material; and
   a conductive material on the seed layer.

9. The device of claim 1, further comprising:
   a second passivation layer on and extending through the electrode and the isolation material, the second passivation layer physically contacting the first reflective structure.

10. A device comprising:
a laser device comprising:
   a laser diode comprising an anode and a cathode;
   a contact pad on the cathode of the laser diode; and
   an underbump metallurgy on the contact pad;
a conductive connector connecting the underbump metallurgy of the laser device to a first pad of a substrate;
a first passivation layer physically contacting a sidewall of the conductive connector and a sidewall of the laser device;
an isolation material on the first passivation layer;
a conductive via extending through the isolation material and the first passivation layer, the conductive via physically contacting a second pad of the substrate; and
an electrode connecting the conductive via to the anode of the laser diode.

11. The device of claim 10, wherein an interface of the underbump metallurgy and the contact pad is free from inter-metallic compounds, the device further comprising:
an inter-metallic compound at an interface of the underbump metallurgy and the conductive connector.

12. The device of claim 10, wherein the electrode has a first portion extending along a top surface of the isolation material and has a second portion extending through the isolation material to contact the anode of the laser diode.

13. The device of claim 10, wherein the contact pad comprises a first conductive material having a first work function, the underbump metallurgy comprises a second conductive material having a second work function, and the cathode comprises a semiconductive material having a third work function, the first work function less than the third work function, the second work function greater than the third work function.

14. The device of claim 13, wherein the first conductive material is Au, GeAu, or Ni; the second conductive material is Ti; and the semiconductive material is GaAs.

15. The device of claim 10, wherein the conductive via comprises:
a conductive material; and
a seed layer around the conductive material, the seed layer separating the conductive material from the isolation material.

16. The device of claim 10, wherein the laser device further comprises:
a passivation layer on the contact pad and the cathode of the laser diode, the underbump metallurgy extending through the passivation layer.

17. A device comprising:
a diode comprising an anode and a cathode;
an electrode comprising a metal layer physically contacting the anode of the diode, the electrode and the anode sharing an ohmic junction;
a conductive via physically contacting the metal layer of the electrode and a first pad of an interconnect structure;
a contact pad physically contacting the cathode of the diode, the contact pad and the cathode sharing an ohmic junction;
a underbump metallurgy physically contacting the contact pad, the underbump metallurgy and the contact pad sharing a metal-metal junction;
a conductive connector physically contacting the underbump metallurgy and a second pad of the interconnect structure;
a first passivation layer physically contacting a sidewall of the conductive connector and a sidewall of the underbump metallurgy; and
an isolation material on the first passivation layer, the conductive via extending through the isolation material and the first passivation layer.

18. The device of claim 17, wherein the conductive via comprises:
a conductive material; and
a seed layer between the conductive material and the isolation material.

19. The device of claim 17, further comprising:
a dielectric layer on the contact pad, the underbump metallurgy extending through the dielectric layer.

20. The device of claim 17, further comprising:
a second passivation layer physically contacting the isolation material, the electrode, and the anode of the diode.

* * * * *